United States Patent
Jiménez-Martínez et al.

(10) Patent No.: US 10,983,177 B2
(45) Date of Patent: Apr. 20, 2021

(54) MAGNETIC FIELD SHAPING COMPONENTS FOR MAGNETIC FIELD MEASUREMENT SYSTEMS AND METHODS FOR MAKING AND USING

(71) Applicant: HI LLC, Los Angeles, CA (US)

(72) Inventors: Ricardo Jiménez-Martínez, North Hills, CA (US); Jamu Alford, Simi Valley, CA (US); Michael Henninger, Austin, TX (US)

(73) Assignee: HI LLC, Los Angeles, CA (US)

( * ) Notice: Subject to any disclaimer, the term of this patent is extended or adjusted under 35 U.S.C. 154(b) by 44 days.

(21) Appl. No.: 16/457,655

(22) Filed: Jun. 28, 2019

(65) Prior Publication Data

US 2020/0057115 A1 Feb. 20, 2020

Related U.S. Application Data

(60) Provisional application No. 62/752,067, filed on Oct. 29, 2018, provisional application No. 62/719,928, filed on Aug. 20, 2018.

(51) Int. Cl.
*G01N 27/72* (2006.01)
*G01R 33/00* (2006.01)
(Continued)

(52) U.S. Cl.
CPC ...... *G01R 33/0011* (2013.01); *G01R 33/0017* (2013.01); *G01R 33/0029* (2013.01);
(Continued)

(58) Field of Classification Search
CPC ............... G01R 33/07; G01R 33/0017; G01R 33/0029; G01R 33/0035; G01R 33/02;
(Continued)

(56) References Cited

U.S. PATENT DOCUMENTS 3,173,082 A 3/1965 Bell et al.
3,257,608 A 6/1966 Bell et al.
(Continued)

FOREIGN PATENT DOCUMENTS

CN 104730484 6/2015
CN 106073751 11/2016
(Continued)

OTHER PUBLICATIONS

CN 107562188A Machine Translation, Jan. 9, 2018 (Year: 2018).*
(Continued)

*Primary Examiner* — Raul J Rios Russo
(74) *Attorney, Agent, or Firm* — Branch Partners PLLC; Bruce E. Black

(57) ABSTRACT

A magnetic field measurement system includes at least one magnetometer; and at least one flux concentrator made of a high magnetic permeability material and configured to receive magnetic field signals from a source, to concentrate the magnetic field signals or reorient the magnetic field signals in a preselected direction, and to direct the concentrated or reoriented magnetic field signals toward at least one of the at least one magnetometer. In addition to, or as an alternative to, the flux concentrator, the system can include a passive shield made of the high magnetic permeability material. The system may also include active shielding.

19 Claims, 12 Drawing Sheets

(51) Int. Cl.
  *G01R 33/032* (2006.01)
  *G01R 33/07* (2006.01)
  *G01R 33/02* (2006.01)
  *G01R 33/025* (2006.01)
  G01R 33/09 (2006.01)

(52) U.S. Cl.
  CPC ..... *G01R 33/0035* (2013.01); *G01R 33/0047* (2013.01); *G01R 33/02* (2013.01); *G01R 33/025* (2013.01); *G01R 33/032* (2013.01); *G01R 33/07* (2013.01); *G01R 33/072* (2013.01); *G01R 33/093* (2013.01)

(58) Field of Classification Search
  CPC .. G01R 33/025; G01R 33/072; G01R 33/093; G01R 33/0011; G01R 33/032; G01R 33/0047; G01R 33/0076; G01R 33/26
  USPC ................... 324/51, 55, 200, 224, 225, 244
  See application file for complete search history.

(56) References Cited

U.S. PATENT DOCUMENTS

| | | |
|---|---|---|
| 3,495,161 A | 2/1970 | Bell |
| 3,501,689 A | 3/1970 | Robbiano |
| 3,513,381 A | 5/1970 | Happer, Jr. |
| 4,193,029 A | 3/1980 | Cioccio et al. |
| 4,951,674 A | 8/1990 | Zanakis et al. |
| 5,189,368 A | 2/1993 | Chase |
| 5,192,921 A | 3/1993 | Chantry et al. |
| 5,225,778 A | 7/1993 | Chaillout et al. |
| 5,254,947 A | 10/1993 | Chaillout et al. |
| 5,309,095 A | 5/1994 | Ahonen et al. |
| 5,442,289 A | 8/1995 | Dilorio et al. |
| 5,444,372 A | 8/1995 | Wikswo, Jr. et al. |
| 5,471,985 A | 12/1995 | Warden |
| 5,506,200 A | 4/1996 | Hirschkoff et al. |
| 5,526,811 A | 6/1996 | Lypchuk |
| 5,713,354 A | 2/1998 | Warden |
| 6,144,872 A | 11/2000 | Graetz |
| 6,339,328 B1 | 1/2002 | Keene et al. |
| 6,472,869 B1 | 10/2002 | Upschulte et al. |
| 6,665,553 B2 | 12/2003 | Kandori et al. |
| 6,806,784 B2 | 10/2004 | Hollberg et al. |
| 6,831,522 B2 | 12/2004 | Kitching et al. |
| 7,038,450 B2 | 5/2006 | Romalis et al. |
| 7,102,451 B2 | 9/2006 | Happer et al. |
| 7,145,333 B2 | 12/2006 | Romalis et al. |
| 7,521,928 B2 | 4/2009 | Romalis et al. |
| 7,656,154 B2 | 2/2010 | Kawabata et al. |
| 7,826,065 B1 | 11/2010 | Okandan et al. |
| 7,872,473 B2 | 1/2011 | Kitching et al. |
| 7,994,783 B2 | 8/2011 | Ledbetter et al. |
| 8,054,074 B2 | 11/2011 | Ichihara et al. |
| 8,212,556 B1 | 7/2012 | Schwindt et al. |
| 8,258,884 B2 | 9/2012 | Borwick, III et al. |
| 8,319,156 B2 | 11/2012 | Borwick, III et al. |
| 8,334,690 B2 | 12/2012 | Kitching et al. |
| 8,373,413 B2 | 2/2013 | Sugioka |
| 8,405,389 B2 | 3/2013 | Sugioka et al. |
| 8,587,304 B2 | 11/2013 | Budker et al. |
| 8,836,327 B2 | 9/2014 | French et al. |
| 8,906,470 B2 | 12/2014 | Overstolz et al. |
| 8,941,377 B2 | 1/2015 | Mizutani et al. |
| 9,084,549 B2 | 7/2015 | Desain et al. |
| 9,095,266 B1 | 8/2015 | Fu |
| 9,116,201 B2 | 8/2015 | Shah et al. |
| 9,140,590 B2 | 9/2015 | Waters et al. |
| 9,140,657 B2 | 9/2015 | Ledbetter et al. |
| 9,169,974 B2 | 10/2015 | Parsa et al. |
| 9,244,137 B2 | 1/2016 | Kobayashi et al. |
| 9,291,508 B1 | 3/2016 | Biedermann et al. |
| 9,343,447 B2 | 3/2016 | Parsa et al. |
| 9,366,735 B2 | 6/2016 | Kawabata et al. |
| 9,383,419 B2 | 7/2016 | Mizutani et al. |
| 9,395,425 B2 | 7/2016 | Diamond et al. |
| 9,417,293 B2 | 8/2016 | Schaffer et al. |
| 9,429,918 B2 | 8/2016 | Parsa et al. |
| 9,568,565 B2 | 2/2017 | Parsa et al. |
| 9,575,144 B2 | 2/2017 | Kornack et al. |
| 9,601,225 B2 | 3/2017 | Parsa et al. |
| 9,638,768 B2 | 5/2017 | Foley et al. |
| 9,639,062 B2 | 5/2017 | Dyer et al. |
| 9,677,905 B2 | 6/2017 | Waters et al. |
| 9,726,626 B2 | 8/2017 | Smith et al. |
| 9,726,733 B2 | 8/2017 | Smith et al. |
| 9,791,536 B1 | 10/2017 | Alem et al. |
| 9,829,544 B2 | 11/2017 | Bulatowicz |
| 9,846,054 B2 | 12/2017 | Waters et al. |
| 9,851,418 B2 | 12/2017 | Wolf et al. |
| 9,869,731 B1 | 1/2018 | Hovde et al. |
| 9,915,711 B2 | 3/2018 | Kornack et al. |
| 9,927,501 B2 | 3/2018 | Kim et al. |
| 9,948,314 B2 | 4/2018 | Dyer et al. |
| 9,964,609 B2 | 5/2018 | Ichihara et al. |
| 9,964,610 B2 | 5/2018 | Shah et al. |
| 9,970,999 B2 | 5/2018 | Larsen et al. |
| 9,995,800 B1 | 6/2018 | Schwindt et al. |
| 10,024,929 B2 | 7/2018 | Parsa et al. |
| 10,088,535 B1 | 10/2018 | Shah |
| 10,162,016 B2 | 12/2018 | Gabrys et al. |
| 10,194,865 B2 | 2/2019 | Le et al. |
| 10,314,508 B2 | 6/2019 | Desain et al. |
| 10,371,764 B2 | 8/2019 | Morales et al. |
| 2004/0232912 A1 | 11/2004 | Tsukamoto et al. |
| 2005/0007118 A1 | 1/2005 | Kitching et al. |
| 2005/0046851 A1 | 3/2005 | Riley, Jr. et al. |
| 2005/0206377 A1 | 9/2005 | Romalis et al. |
| 2007/0076776 A1 | 4/2007 | Lust et al. |
| 2007/0120563 A1 | 5/2007 | Kawabata et al. |
| 2007/0167723 A1 | 7/2007 | Park et al. |
| 2007/0205767 A1 | 9/2007 | Xu et al. |
| 2009/0079426 A1 | 3/2009 | Anderson |
| 2009/0101806 A1 | 4/2009 | Masuda |
| 2010/0039106 A1* | 2/2010 | Edelstein ............... G01R 33/05 324/253 |
| 2010/0219820 A1 | 9/2010 | Skidmore et al. |
| 2011/0062956 A1 | 3/2011 | Edelstein et al. |
| 2012/0112749 A1 | 5/2012 | Budker et al. |
| 2013/0082700 A1 | 4/2013 | Mizutani et al. |
| 2013/0082701 A1 | 4/2013 | Mizutani et al. |
| 2013/0265042 A1 | 10/2013 | Kawabata et al. |
| 2013/0314092 A1* | 11/2013 | Shumway ................. G01V 3/40 324/346 |
| 2014/0121491 A1 | 5/2014 | Zhang |
| 2014/0306700 A1 | 10/2014 | Kamada et al. |
| 2014/0354275 A1 | 12/2014 | Sheng et al. |
| 2015/0022200 A1 | 1/2015 | Ichihara et al. |
| 2015/0054504 A1 | 2/2015 | Ichihara et al. |
| 2015/0108974 A1* | 4/2015 | Kennedy ............... G01R 33/098 324/252 |
| 2015/0378316 A1 | 12/2015 | Parsa et al. |
| 2016/0061913 A1 | 3/2016 | Kobayashi et al. |
| 2016/0116553 A1 | 4/2016 | Kim et al. |
| 2016/0223627 A1 | 8/2016 | Shah et al. |
| 2016/0291099 A1 | 10/2016 | Ueno |
| 2016/0313417 A1 | 10/2016 | Kawabata et al. |
| 2017/0023653 A1 | 1/2017 | Kobayashi et al. |
| 2017/0023654 A1 | 1/2017 | Kobayashi et al. |
| 2017/0067969 A1 | 3/2017 | Butters et al. |
| 2017/0199138 A1 | 7/2017 | Parsa et al. |
| 2017/0199251 A1 | 7/2017 | Fujii et al. |
| 2017/0261564 A1 | 9/2017 | Gabrys et al. |
| 2017/0331485 A1 | 11/2017 | Gobet et al. |
| 2017/0343617 A1 | 11/2017 | Manickam et al. |
| 2017/0343695 A1 | 11/2017 | Stetson et al. |
| 2017/0356969 A1 | 12/2017 | Ueno |
| 2018/0003777 A1 | 1/2018 | Sorenson et al. |
| 2018/0038921 A1 | 2/2018 | Parsa et al. |
| 2018/0100749 A1 | 4/2018 | Waters et al. |
| 2018/0128885 A1 | 5/2018 | Parsa et al. |
| 2018/0156875 A1 | 6/2018 | Herbsommer et al. |
| 2018/0219353 A1 | 8/2018 | Shah |
| 2018/0238974 A1 | 8/2018 | Shah et al. |

(56) References Cited

U.S. PATENT DOCUMENTS

| | | |
|---|---|---|
| 2018/0313908 A1 | 11/2018 | Knappe et al. |
| 2018/0313913 A1 | 11/2018 | DeNatale et al. |
| 2019/0391213 A1* | 12/2019 | Alford .................. G01R 33/26 |
| 2020/0025844 A1 | 1/2020 | Alford et al. |
| 2020/0057115 A1 | 2/2020 | Jiménez-Martínez et al. |
| 2020/0057116 A1* | 2/2020 | Zorzos .................. G01R 33/26 |
| 2020/0072916 A1 | 3/2020 | Alford et al. |
| 2020/0088811 A1 | 3/2020 | Mohseni |
| 2020/0241094 A1 | 7/2020 | Alford |
| 2020/0256929 A1 | 8/2020 | Ledbetter et al. |
| 2020/0309873 A1 | 10/2020 | Ledbetter et al. |
| 2020/0334559 A1 | 10/2020 | Anderson et al. |
| 2020/0341081 A1 | 10/2020 | Mohseni et al. |
| 2020/0381128 A1 | 12/2020 | Pratt et al. |
| 2020/0400763 A1 | 12/2020 | Pratt |

FOREIGN PATENT DOCUMENTS

| | | |
|---|---|---|
| CN | 107562188 | 1/2018 |
| EP | 2738627 A3 | 6/2014 |
| EP | 2380029 B1 | 10/2015 |
| EP | 3037836 B1 | 9/2017 |
| JP | 2012100839 | 5/2012 |
| JP | 2016109665 | 6/2016 |
| JP | 2018004462 | 1/2018 |
| WO | 2005/081794 | 9/2005 |
| WO | 2014/031985 | 2/2014 |
| WO | 2017/095998 | 6/2017 |

OTHER PUBLICATIONS

International Search Report and Written Opinion for PCT Application No. PCT/US2019/039984 dated Sep. 27, 2019.
Allred, J. C., Lyman, R. N., Komack, T. W., & Romalis, M. V. (2002). High-sensitivity atomic magnetometer unaffected by spin-exchange relaxation. Physical review letters, 89(13), 130801.
Balabas et al. Polarized alkali vapor with minute-long transverse spin-relaxation time, Phys. Rev. Lett. 105, 070801—Published Aug. 12, 2010.
Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.
Dmitry Budker and Michael Romalis, "Optical Magnetometry," Nature Physics, 2008, https://arxiv.org/abs/physics/0611246v1.
Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).
Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.
Donley, E.A. & Hodby, E & Hollberg, L & Kitching, J. (2007). Demonstration of high-performance compact magnetic shields for chip-scale atomic devices. The Review of scientific instruments. 78. 083102.
Hämäläinen; Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2. 413-497.
Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.
Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. EEEE Transactions on Instrumentation and Measurement, 59(2), 372-378.
Kiwoong Kim, Samo Begus, Hui Xia, Seung-Kyun Lee, Vojko Jazbinsek, Zvonko Trontelj; Michael V. Romalis, Multi-channel atomic magnetometer for magnetoencephalography: A configuration study. NeuroImage 89 (2014) 143-151 http://physics.princeton.edu/romalis/papers/Kim_2014.pdf.
Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.
Kominis, I.K., Kornack, T.W., Allred, J.C. and Romalis, M.V., 2003. A subfemtotesla multichannel atomic magnetometer. Nature. 422(6932), p. 596.
Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.
Lenz, J. and Edelstein, S., 2006. Magnetic sensors and their applications. IEEE Sensors journal, 6(3), pp. 631-649.
Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.
Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.
Sander TH, Preusser J, Mhaskar R, Kitching J, Trahms L, Knappe S. Magnetoencephalography with a chip-scale atomic magnetometer. Biomed Opt Express, 2012;3(5):981-90.
J. Seltzer, S & Romalis, Michael. (2010). High-temperature alkali vapor cells with antirelaxation surface coatings. Journal of Applied Physics. 106. 114905-114905. 10.1063/1.3236649.
Seltzer, S. J., and Romalis, M.V., "Unshielded three-axis vector operation of a spin-exchange-relaxation-free atomic magnetometer." Applied physics letters 85.20 (2004): 4804-4806.
Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.
Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.
Volkmar Schultze et al. An Optically Pumped Magnetometer Working in the Light-Shift Dispersed Mz Mode, Sensors 2017, 17, 561; doi:10.3390/s17030561.
Fang, J. and Qin, J., 2012. In situ triaxial magnetic field compensation for the spin-exchange-relaxation-free atomic magnetometer. Review of Scientific Instruments, 83(10), p. 103104.
Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.
Griffith, Clark & Jimenez-Martinez, Ricardo & Shah, Vishal & Knappe, Svenja & Kitching, John. (2009), Miniature atomic magnetometer integrated with flux concentrators. Applied Physics Letters—Appl Phys Lett. 94. 10.1063/1.3056152.
Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.
Vovrosh, Jamie & Vaulazeris, Georgios & Petrov, Plamen & Zou, Ji & Gaber Beshay, Youssef & Benn, Laura & Woolger, David & Attaliah, Moataz & Boyer, Vincent & Bongs, Kai & Holynski, Michael. (2018), Additive manufacturing of magnetic shielding and ultra-high vacuum flange for cold atom sensors. Scientific Reports. 8. 10.1038/s41598-018-20352-x.
Kim, Young Jin & Savukov, I. (2016). Ultra-sensitive Magnetic Microscopy with an Optically Pumped Magnetometer. Scientific Reports. 6. 24773. 10.1038/srep24773.

(56) References Cited

OTHER PUBLICATIONS

Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.

Orang Alem, Rahui Mhaskar, Ricardo Jiménez-Martínez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).

Slocum et al., Self-Calibrating Vector Magnetometer for Space, https://esto.nasa.gov/conferences/estc-2002/Papers/B3P4(Slocum).pdf.

Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69) 90480-0.

J. A. Neuman, P. Wang, and A. Gallagher, Robust high-temperature sapphire cell for metal vapors, Review of Scientific Instruments, vol. 66, Issue 4, Apr. 1995, pp. 3021-3023.

Borna, Amir, et al. "A 20-channel magnetoencephalography system based on optically pumped magnetometers," Physics in Medicine & Biology 62.23 (2017): 8909.

R. E. Slocum & L. J. Ryan, Design and operation of the minature vector laser magnetometer, Nasa Earth Science Technology Conference 2003.

Schoenmaker, Jeroen & R Pirota, K & Teixeira, Julio. (2013). Magnetic flux amplification by Lenz lenses. The Review of scientific instruments. 84. 085120. 10.1063/1.4819234.

Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.

Masuda, Y & Ino, T & Skoy, Vadim & Jones, G.L. (2005). 3He polarization via optical pumping in a birefringent cell, Applied Physics Letters. 87. 10.1063/1.2008370.

A.B. Baranga et al., An atomic magnetometer for brain activity imaging, Real Time Conference 2005. 14th IEEE-NPSS. pp. 417-418.

Larry J. Ryan, Robert E. Slocum, and Robert B. Steves, Miniature Vector Laser Magnetometer Measurements of Earth's Field, May 10, 2004, 4 pgs.

Lorenz, V. O., Dai, X., Green, H., Asnicar, T. R., & Cundiff, S. T. (2008). High-density, high-temperature alkali vapor cell. Review of Scientific Instruments, 79(12), 4 pages.

F. Jackson Kimball, D & Dudley, J & Li, Y & Thulasi, Swecha & Pustelny, Szymon & Budker, Dmitry & Zolotorev, Max. (2016). Magnetic shielding and exotic spin-dependent interactions. Physical Review D. 94. 10.1103/PhysRevD.94.082005.

Huang, Haichao, et al. "Single-beam three-axis atomic magnetometer." Applied Physics Letters 109.6 (2016): 062404. (Year: 2016).

Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalisipapers/Seltzer%20Thesis.pdf [retrieved on Aug. 29, 2019] pp. 148-159.

Haifeng Dung et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.

Hill RM, Bobo E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/s41467-019-12486-x.

Zetter, R., Iivanainen, J. & Parkkonen, L. Optical Co-registration of MRI and On-scalp MEG. Sci Rep 9, 5490 (2019). https://doi.org/10.1038/s41598-019-41763-4.

Garrido-Jurado, Sergio, Rafael Munoz-Salinas, Francisco José Madrid-Cuevas and Manuel J. Marin-Jiménez. "Automatic generation and detection of highly reliable fiducial markers under occlusion." Pattern Recognit. 47 (2014): 2280-2292.

Hill RM, Bobo E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field compensation in wearable magnetoencephalography. Sci Rep 9, 14196 (2019).

N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et. al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space , 53 (10), 949-958.

Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.

Vrba J, Robinson SE. Signal processing in magnetoencephalography. Methods. 2001;25(2):249-271. doi:10.1006/meth.2001.1238.

Uusitalo M and Ilmoniemi R., 1997, Signal-space projection method for separating MEG or EEG into components. Med. Biol. Comput. (35) 135-140.

Taulu S and Kajola M., 2005, Presentation of electromagnetic multichannel data: the signal space separation method. J. Appl. Phys. (97) 124905 (2005).

Taulu S, Simola J and Kajola M., 2005, Applications of the signal space separation method. IEEE Trans. Signal Process. (53) 3359-3372 (2005).

Taulu S, Simola J., 2006, Spatiotemporal signal space separation method for rejecting nearby interference in MEG measurements. Phys. Med. Biol. (51) 1759-1768 (2006).

Johnson, et al., Magnetoencephalography with a two-color pump-probe, fiber-coupled atomic magnetometer, Applied Physics Letters 97, 243703 2010.

Zhang, et al., Magnetoencephalography using a compact multichannel atomic magnetometer with pump-probe configuration, AIP Advances 8, 125028 (2018).

Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.

Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).

Oyama D. Dry phantom for magnetoencephalography—Configuration, calibration, and contribution. J Neurosci Methods. 2015;251:24-36. doi: 0.1016/j.jneumeth.2015.05.004.

Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.

Eklund, E. Jesper, Andrei M. Shkel, Svenja Knappe, Elizabeth A. Donley and John Kitching. "Glass-blown spherical microcells for chip-scale atomic devices." (2008).

(56) References Cited

OTHER PUBLICATIONS

Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.
Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers" NeuroImage 149 (Apr. 1, 2017): 404-14.
Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.
Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.
Pasquarelli, A, M De Melis, Laura Marzetti, Hans-Peter Müller, and S N Erné. "Calibration of a Vector-MEG Helmet System." Neurology & Clinical Neurophysiology☐: NCN 2004 (Feb. 1, 2004): 94.
Pfeiffer, Christoph, Lau M. Andersen, Daniel Lundgvist, Matti Hamalainen, Justin F. Schneiderman, and Robert Oostenveld. "Localizing On-Scalp MEG Sensors Using an Array of Magnetic Dipole Coils." PLOS One 13, No. 5 (May 10, 2018): e0191111.
Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.
Nagel, S., & Spuler, M. (2019). Asynchronous non-invasive high-speed BCI speller with robust non-control state detection. Scientific Reports, 9(1), 8269.
Thielen, J., van den Broek, P., Farquhar, J., & Desain, P. (2015). Broad-Band Visually Evoked Potentials: Re(con)volution in Brain-Computer Interfacing. PloS One, 10(7), e0133797. https://doi.org/10.1371/journal.pone.0133797.
J. Kitching, "Chip-scale atomic devices," Appl. Phys. Rev. 5(3), 031302 (2018), 39 pages.
Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.
Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.
Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.
Effect of magnetic anisotropy on magnetic shaking, E. Papernoa and I. Sasada. Journal of Applied Physics, vol. 85—Apr. 8, 1999, pp. 4645-4647.
Feynman Lectures on Physics vol. II, Chapter 37. 1963. Richard Feynman, Robert Leighton, http://www.feynmanlectures.caltech.edu/II_37.html.
Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.
Arjen Stolk, Ana Todorovic, Jan-Mathijs Schoffelen, and Robert Oostenveld. "Online and offline tools for head movement compensation in MEG." Neuroimage 68 (2013): 39-48.
Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

* cited by examiner

MAGNETIC FIELD SHAPING COMPONENTS FOR MAGNETIC FIELD MEASUREMENT SYSTEMS AND METHODS FOR MAKING AND USING

CROSS-REFERENCE TO RELATED APPLICATIONS

This application claims the benefit of U.S. Provisional Patent Application Ser. Nos. 62/719,928, filed Aug. 20, 2018, and 62/752,067, filed Oct. 29, 2018, both of which are incorporated herein by reference in their entireties.

FIELD

The present disclosure is directed to the area of magnetic field measurement systems using optically pumped magnetometers or other suitable magnetometers. The present disclosure is also directed to magnetic field measurement systems that include a magnetic field shaping component, such as a passive shield or flux concentrator, to facilitate measurements by an optically pumped magnetometer or other suitable magnetometers.

BACKGROUND

In the nervous system, neurons propagate signals via action potentials. These are brief electric currents which flow down the length of a neuron causing chemical transmitters to be released at a synapse. The time-varying electrical current within the neuron generates a magnetic field, which propagates through the human body. Magnetoencephalography (MEG), the measurement of magnetic fields generated by the brain, is one method for observing these neural signals.

Existing systems for observing or measuring MEG typically utilize Superconductive Quantum Interference Devices (SQUIDs) or collections of discrete Optically Pumped Magnetometers (OPMs). In this disclosure the OPM is primarily considered because the SQUID system requires cryogenic cooling, which is prohibitively costly and bulky and requires a lot of maintenance which preclude their use in mobile or wearable devices.

Optical magnetometry can include the use of optical methods to measure a magnetic field with very high accuracy—on the order of $1\times10^{-15}$ Tesla. Of particular interest for their high-sensitivity, OPMs can be used in optical magnetometry to measure weak magnetic fields. In at least some embodiments, the OPM has an alkali vapor gas cell that contains alkali metal atoms in a combination of gas, liquid, or solid states (depending on temperature). The gas cell may contain a quenching gas, buffer gas, or specialized antirelaxation coatings or any combination thereof. The size of the gas cells can vary from a fraction of a millimeter up to several centimeters.

BRIEF SUMMARY

One embodiment is a magnetic field measurement system that includes at least one magnetometer; and at least one flux concentrator made of a high magnetic permeability material and configured to receive magnetic field signals from a source, to concentrate the magnetic field signals or reorient the magnetic field signals in a preselected direction, and to direct the concentrated or reoriented magnetic field signals toward at least one of the at least one magnetometer.

In at least some embodiments, each of the at least one flux concentrator includes a first end and a second end opposite the first end, wherein the flux concentrator is tapered so that the first end has a larger surface area than the second end. In at least some embodiments, each of the at least one flux concentrator has a conical or pyramidal shape. In at least some embodiments, the conical or pyramidal shape is truncated at one end. In at least some embodiments, the high magnetic permeability material is selected from ferrite, Mu-metal, or any combination thereof.

In at least some embodiments, the at least one magnetometer includes a plurality of magnetometers and the at least one flux concentrator includes a plurality of flux concentrators. In at least some embodiments, each of the flux concentrators is configured to direct the concentrated or reoriented magnetic field signals to a different one of the magnetometers. In at least some embodiments, at least two of the magnetometers form a gradiometer. In at least some embodiments, one of the flux concentrators is configured to direct the concentrated or reoriented magnetic field signals toward at least one, but less than all, of the magnetometers of the gradiometer.

In at least some embodiments, the magnetic field measurement system further includes a passive shield disposed around the at least one magnetometer and configured to reduce an ambient background magnetic field at the at least one magnetometer. In at least some embodiments, the passive shield is made of a high magnetic permeability material. In at least some embodiments, the passive shield is formed in a shape of a helmet, hood, cap, or other shape conformable to a user's head.

In at least some embodiments, the magnetic field measurement system further includes a magnetic field generator disposed around the at least one magnetometer and configured to reduce an ambient background magnetic field at the at least one magnetometer. In at least some embodiments, the magnetic field measurement system is configured to operate the at least one magnetometer in the scalar mode. In at least some embodiments, the magnetic field measurement system is configured to operate the at least one magnetometer in the SERF mode.

Another embodiments is a wearable magnetic field measurement system that includes a plurality of magnetometers arranged in an array; and a passive shield formed of a high magnetic permeability material and disposed around the magnetometers and configured to reduce an ambient background magnetic field at the magnetometers, wherein the passive shield is shaped to fit over a body region, for example, a user's head, upon which the magnetometers and passive shield are to be worn.

In at least some embodiments, the passive shield is formed in a shape of a helmet, hood, cap, or other shape conformable to a user's head. In at least some embodiments, the magnetic field measurement system further includes a magnetic field generator disposed around the at least one magnetometer and configured to reduce an ambient background magnetic field at the at least one magnetometer. In at least some embodiments, the magnetic field measurement system further includes at least one flux concentrator configured to receive magnetic field signals from a source, to concentrate the magnetic field signals or reorient the magnetic field signals in a preselected direction, and to direct the concentrated or reoriented magnetic field signals toward at least one of the at least one magnetometer.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present disclosure is directed to the area of magnetic field measurement systems using optically pumped magnetometers or other suitable magnetometers. The present disclosure is also directed to magnetic field measurement systems that include a magnetic field shaping component, such as a passive shield or flux concentrator, to facilitate measurements by an optically pumped magnetometer or other suitable magnetometers.

An optically pumped magnetometer (OPM) is a basic component used in optical magnetometry to measure magnetic fields. A magnetic field measurement system, as described herein, can include one or more (for example, an array of) optically pumped magnetometers, for example, one or more SERF zero-field vector magnetometers or scalar magnetometers. The magnetic field measurement system can be used to measure or observe electromagnetic signals generated by one or more sources (for example, biological sources). The system can measure biologically generated magnetic fields and, at least in some embodiments, can measure biologically generated magnetic fields in an unshielded environment. Aspects of a magnetic field measurement system will be exemplified below using magnetic signals from the brain of a user; however, biological signals from other areas of the body, as well as non-biological signals, can be measured using the system. Uses for this technology outside biomedical sensing include, but are not limited to, navigation, mineral exploration, non-destructive testing, detection of underground devices, asteroid mining, and space travel. The OPM may be replaced by other magnetometers (e.g. nitrogen vacancy diamond sensors) as technological advances improve their sensitivity to the required levels.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

Figure 1A:
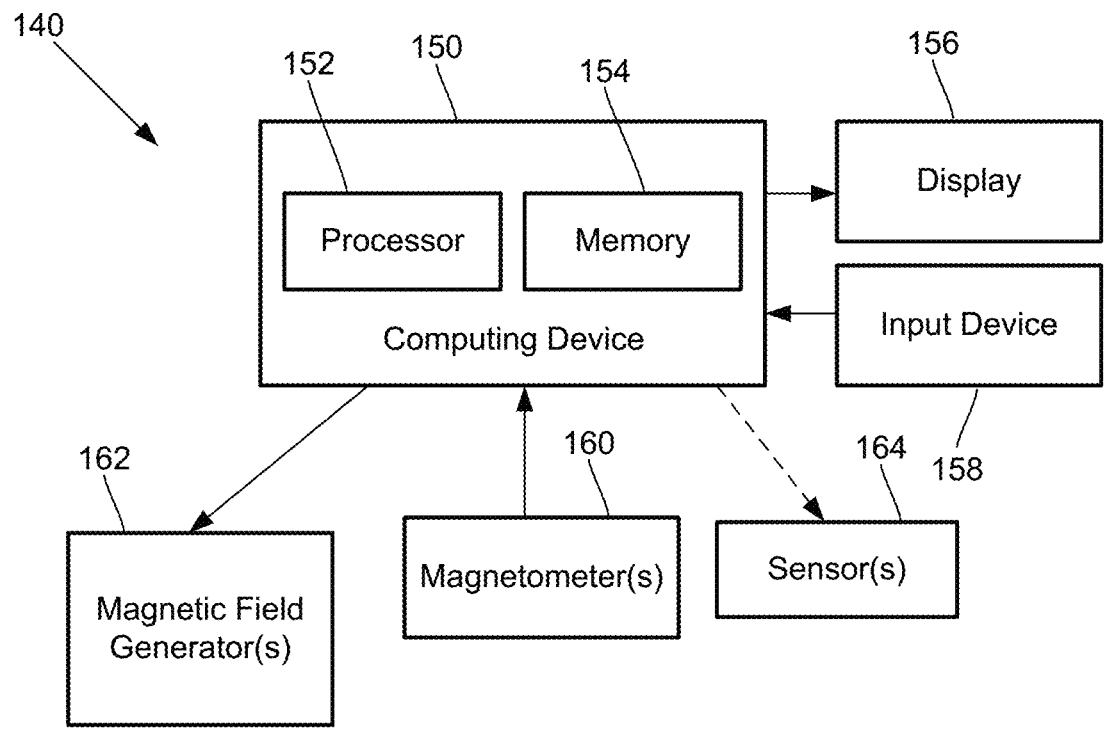
FIG. 1A is a schematic block diagram of one embodiment of a magnetic field measurement system, according to the invention.

FIG. 1A is a block diagram of components of one embodiment of a magnetic field measurement system 140. The system 140 can include a computing device 150 or any other similar device that includes a processor 152 and a memory 154, a display 156, an input device 158, one or more magnetometers 160 (for example, one or more vector magnetometers), optionally, one or more magnetic field generators 162, and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, field programmable gate array (FPGA), or any other suitable device for processing information. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions provided to the processor 152, as described below.

Any suitable memory 154 can be used for the computing device 150. The memory 154 illustrates a type of computer-readable media, namely computer-readable storage media. Computer-readable storage media may include, but is not limited to, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. In at least some embodiments, the display is not local to the user. The input device 158 can be, for example, a keyboard, mouse, touch screen, track ball, joystick, voice recognition system, or any combination thereof, or the like. In at least some embodiments, the input device is not local to the user.

The magnetometers 160 can be any suitable magnetometers including, but not limited to, any suitable optically pumped magnetometers (e.g., vector or scalar magnetometers), such as SERF zero-field vector magnetometers or scalar magnetometers. In at least some embodiments, an optically pumped magnetometer can be operated in either the SERF mode or the scalar mode. In at least some embodiments, the system utilizes magnetometers operating in the SERF mode. In at least some embodiments, the system utilizes magnetometers operating in the scalar mode. In at least some embodiments, the system utilizes magnetometer that operate in the SERF mode and magnetometers that operate in the scalar mode. In at least some embodiments, the system utilizes magnetometers which may operate in either the SERF mode or the scalar mode. Examples of dual mode systems are disclosed in U.S. Patent Provisional Patent Application Ser. No. 62/723,933, incorporated herein by reference.

The optional magnetic field generator(s) 162 can be, for example, Helmholtz coils, solenoid coils, planar coils, saddle coils, electromagnets, permanent magnets, or any other suitable arrangement for generating a magnetic field. The optional sensor(s) 164 can include, but are not limited to, one or more magnetic field sensors, position sensors, orientation sensors, accelerometers, image recorders, or the like or any combination thereof.

An alkali metal vector magnetometer can be operated as a zero-field magnetometer with the ability to operate in SERF mode with suppressed spin-exchange relaxation. At finite magnetic fields, such that the Larmor precession frequency is much higher than the intrinsic spin relaxation, the same device can be used to measure the absolute value of the field in a configuration known as a scalar magnetometer.

Figure 1B:
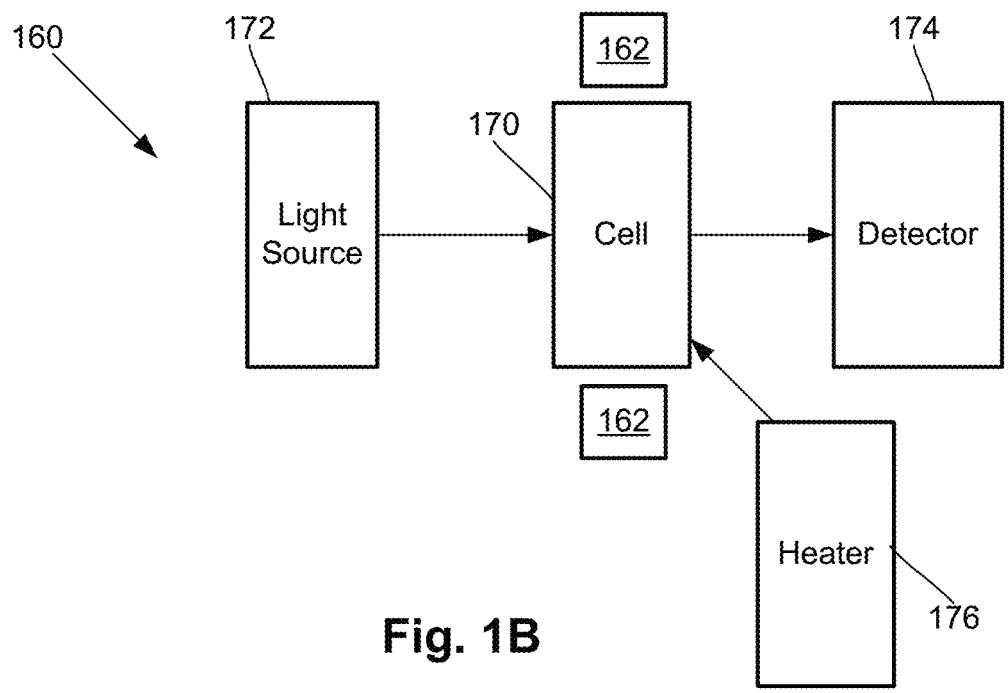
FIG. 1B is a schematic block diagram of one embodiment of a magnetometer, according to the invention.

FIG. 1B is a schematic block diagram of one embodiment of a magnetometer 160 which includes an alkali metal gas cell 170 (also referred to as a "cell") containing an alkali metal vapor (for example, rubidium in natural abundance, isotopically enriched rubidium, potassium, or cesium, or any other suitable alkali metal such as lithium, sodium, potassium, rubidium, cesium, or francium), quenching gas (for example, nitrogen) and buffer gas (for example, nitrogen, helium, neon, or argon); a heating device 176 to heat the cell 170; a light source 172, such as a laser to optically pump the alkali metal atoms and to probe the gas cell, as well as optics (such as lenses, waveplates, collimators, polarizers, and objects with reflective surfaces) for beam shaping and polarization control and for directing the light from the light source to the cell and detector; and a detector 174 (for example, an optical detector to measure the optical properties of the transmitted light field amplitude, phase, or polarization, as quantified through optical absorption and dispersion curves, spectrum, or polarization or the like or any combination thereof). In addition, coils of a magnetic field generator 162 can be positioned around the vapor cell 170. In a scalar magnetometer (e.g., an optically pumped magnetometer operating in the scalar mode), in addition to the above elements, a local oscillator (LO) is added to drive the spin precession on resonance with the Larmor frequency as set by the given ambient field. The excitation can be introduced in the form of an RF field generated using the field generators or optically by modulating the intensity, frequency, or polarization of the pumping light beam.

Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source. Examples of suitable detectors include, but are not limited to, a photodiode, charge coupled device (CCD) array, CMOS array, camera, photodiode array, single photon avalanche diode (SPAD) array, avalanche photodiode (APD) array, or any other suitable optical sensor array that can measure the change in transmitted light at the optical wavelengths of interest.

Examples of magnetic field measurement systems are described in U.S. patent application Ser. Nos. 16/213,980; 16/405,382; 16/418,478; 16/418,500; 16/428,871; and Ser. No. 16/456,975, and U.S. Provisional Patent Application Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; 62/842,818; 62/855,820; 62/858,636; 62/860,001; and 62/865,049, all of which are incorporated herein by reference.

While there are many different types of magnetometers, the description herein will use optically pumped magnetometers (OPMs) as an example. Similar results can also be accomplished using other magnetic sensors such as nitrogen-vacancy (NV) diamond sensors or magnetoresistance sensors. It will be understood that these magnetic sensors or any other type sensors improved to the necessary sensitivity can be used in place of the magnetometers in any of the embodiments described herein.

As described above, optically pumped magnetometers (OPMs) can often be either grouped into two architectures or operational modes: spin-relaxation-free (SERF) vector magnetometers or scalar magnetometers. SERF magnetometers have high sensitivity but, conventionally, cannot function in a magnetic field higher than 50 nT which is approximately 1/1000 of the magnetic field strength generated by the Earth. As a result, conventional SERF devices usually operate inside magnetically shielded rooms that isolate the sensor from ambient magnetic fields including the Earth's magnetic field.

To use a SERF magnetometer outside a shielded room either a passive or active magnetic shield (or both) can be used. In at least some embodiments, as described below, a passive magnetic shield routes the magnetic field away from the sensor by providing an alternate path around the sensor, this is similar to the effect of a shielded room but in a smaller form factor. In at least some embodiments, sufficient shielding can be achieved even with a passive shield containing large openings through the shield by collecting the field lines sufficiently far away from the shielded region, guiding them around the openings, and releasing them sufficiently far beyond the shielded region. This is in contrast to typical magnetic shielding which achieves high shielding factors by encompassing the shielded region as completely as possible while using a compact shield structure. An active magnetic shield generates, for example, an equal and opposite magnetic vector that cancels out, or substantially reduces, the Earth's magnetic field.

Scalar magnetometers have lower sensitivity but may be able to operate in unshielded magnetic field environments up to and including the Earth field, which is about 50 µT.

In either mode (SERF or scalar optically pumped magnetometers) magnetic noise can be important. For instance, in at least some applications of OPMs that involves measuring magnetic field signals from the brain (i.e., magnetoencephalography or MEG), at least some magnetic noise comes from oscillations of the magnetic field which can have the same frequencies as neural signals and can overwhelm the magnetic signals of the brain. If these signals originate far from the region of interest (for example, the human brain) then they can be suppressed by sampling and then subtracting the ambient background magnetic field. For example, this can be accomplished using a combination of two magnetometers (for example, the technique of gradiometry.) First order gradiometer uses two magnetometers, second order three magnetometers, and so forth. The higher the order the better background is suppressed but results in a more complicated system with many magnetometers that just measure the ambient background magnetic field and don't contribute to the measurement of the brain's magnetic field signals.

Herein are described methods for suppressing ambient background magnetic fields (both static fields and time varying fields that can be generated from the Earth or other sources, for example, magnetic noise) that may limit magnetic field detection (for example, detection of MEG) through the use of high magnetic permeability materials, such as ferrite, Mu-metal, or Metglas. (The use of Metglas, such as, for example, Metglas™ 2705 or Metglas™ 2714 (available from Metglas, Inc., Conway, S.C., USA) or Vitrovac™ 6025 X (available from Sekels GmbH, Ober-Mörlen, Germany), for magnetic field suppression or magnetic field shielding is also described in U.S. Provisional Patent Application Ser. No. 62/827,390, incorporated herein by reference.)

These materials have high magnetic permeability but do not retain the magnetic field once the external field is removed. Furthermore, in at least some embodiments, these same materials can be used to amplify or concentrate neural magnetic field signals. Additionally, magnetically anisotropic materials (e.g., high magnetic permeability materials) may be used to selectively amplify or concentrate neural magnetic field signals with tailored directional sensitivity. In at least some embodiments, the combination of these technologies can be used create a "magnetic microscope" for a wearable MEG system.

In at least some embodiments, the methods and arrangements described herein can be used to produce a wearable MEG system that can operate outside a magnetically shielded room to measure biological or other magnetic fields. In addition, the concepts, methods, arrangements, and systems described herein can be utilized to improve performance in, or simplify, SERF magnetometer systems or scalar magnetometer systems (including those systems with a large cell or a multipass cell).

In at least some embodiments, high magnetic permeability materials, including, but not limited to, high magnetic permeability materials such as ferrite, Mu-metal, and Metglas is used to redirect or concentrate magnetic fields (for example, the ambient background magnetic field or biological magnetic fields) within a given region of space to improve the sensitivity of SERF sensors. In addition, these high magnetic permeability materials can be used to operate scalar OPMs in unshielded environments or to detect MEG. The high magnetic permeability material, or composite materials containing a high magnetic permeability material, can be formed using sheet metal techniques, casting, or through additive manufacturing (e.g. 3D printing), or any other suitable process. 3D printing technologies can facilitate the manufacturing of flux concentrators from these materials with geometries tailored to pick up magnetic field signals with different spatial orientations, such as those originating in the brain, while discriminating background magnetic field noise.

As used herein, a high magnetic permeability material has a relative magnetic permeability, $\mu_r$, of at least 10 or more. In at least some embodiments, the high magnetic permeability material has a relative magnetic permeability of at least 12, 15, 16, 25, 50, 100, 1000, 10,000, or more. The relative magnetic permeability of a material is equal to $\mu/\mu_0$ where $\mu$ is the magnetic permeability of that material and to is the magnetic permeability of free space ($4\pi \times 10^{-7}$ N A$^{-2}$). Examples of high magnetic permeability materials include soft ferromagnetic materials (such as Mu-metal, and Metglas), hard ferromagnetic materials, superparamagnetic materials (such as ferrofluids), and magnetic metamaterials. (The use of ferrofluids for magnetic field suppression or magnetic field shielding is further disclosed in U.S. patent application Ser. No. 16/456,975, incorporated herein by reference.)

A passive shield or flux concentrator, or any combination thereof, can be used to achieve one or more of the following: 1) reduce a static ambient background magnetic field (for example, the Earth's magnetic field), 2) reduce magnetic field noise (e.g., a time-varying ambient background magnetic field), or 3) amplify the magnetic field signals from the brain. In at least some embodiments, a flux concentrator may be positioned or arranged to enhance the shielding provided by a passive shield. In at least some embodiments, a flux concentrator can direct or reorient the magnetic field toward one or more of the magnetometers. In at least some embodiments, a flux concentrator can direct or reorient the magnetic field away from one or more (or even all) of the magnetometers. In at least some embodiments, a passive shield may be positioned or arranged to enhance the concentration or reorientation of flux by the flux concentrator.

One or more of these achievements can significantly improve the performance of SERF or scalar OPM approaches and systems, but at the cost of additional weight on a wearable device. In at least some embodiments, this weight can be offset by one or more of the following: A) a reduction in the strength of any active shields (to reduce weight or power consumption or any combination thereof), B) a suppression of any magnetic field arising from regions outside the imaging area (so that, for example, the system can operate with a lower order gradiometer, or possibly no gradiometer, which may reduce size, weight, or power consumption or any combination thereof), or C) an increase in sensitivity (so that, for example, a smaller alkali vapor cell can be used which may reduce size or power consumption or any combination thereof). Smaller size or reduced power consumption may directly translate into less weight in a wearable system. It will be recognized however, that a passive shield or flux concentrator made of high magnetic permeability material positioned is too close to the magnetometer may add thermal noise to the measurement.

Figure 2:
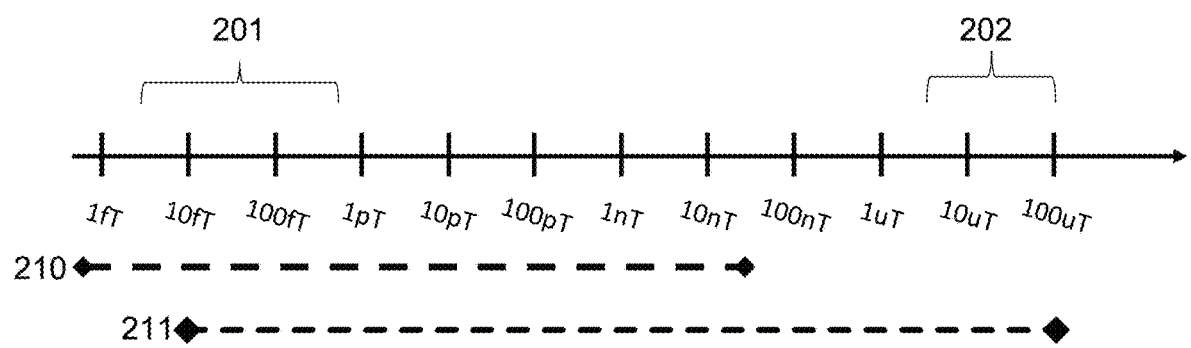
FIG. 2 shows a magnetic spectrum with lines indicating dynamic ranges of magnetometers operating in different modes.

FIG. 2 shows the magnetic spectrum from 1 fT to 100 μT in power on a logarithmic scale. The magnitude of magnetic fields generated by the human brain are indicated by range 201 and the magnitude of the background ambient magnetic field, including the Earth's magnetic field, by range 202. The strength of the Earth's magnetic field covers a range as it depends on the position on the Earth as well as the materials of the surrounding environment where the magnetic field is measured. Range 210 indicates the approximate measurement range of a magnetometer operating in the SERF mode (e.g., a SERF magnetometer) and range 211 indicates the approximate measurement range of a magnetometer operating in the scalar mode (e.g., a scalar magnetometer.) Typically, a SERF magnetometer is more sensitive than a scalar magnetometer but many conventional SERF magnetometers typically only operate up to about 20 to 200 nT while the scalar magnetometer starts in the 10 to 100 fT range but extends above 10 to 100 μT. At very high magnetic fields the scalar magnetometer typically becomes nonlinear due to a nonlinear Zeeman splitting of atomic energy levels.

Figure 3A:
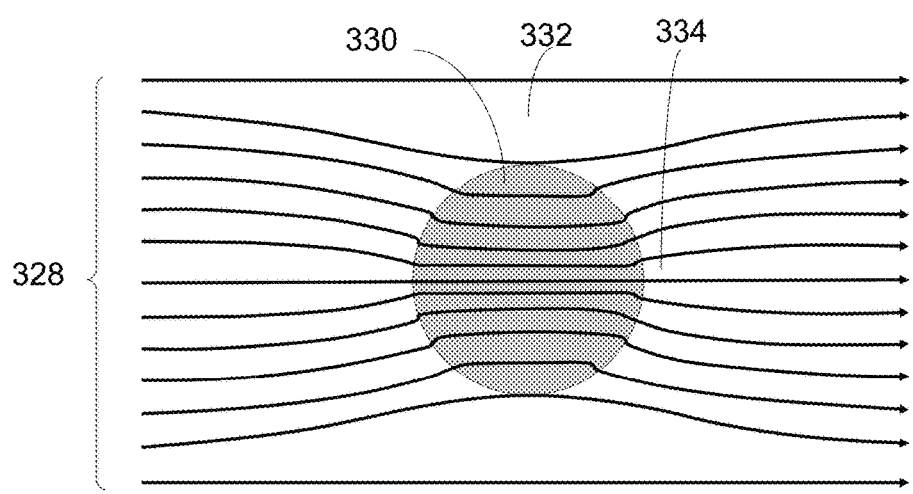
FIG. 3A is a schematic view of magnetic field lines interacting with a high magnetic permeability sphere.

FIG. 3A illustrates magnetic field lines 328 interacting with a sphere 330 made of a high magnetic permeability material, such as a ferromagnetic material (for example, ferrite, Mu-metal, and Metglas). The field lines are bent into the material and flow through the sphere 330 leaving magnetically shielded regions 332 adjacent to the sphere 330 as well as a region 334 of increased field strength. In field line plots, the closer the magnetic field lines, the stronger the field in the region. Conversely, the further apart the field lines, the weaker the field.

Figure 3B:
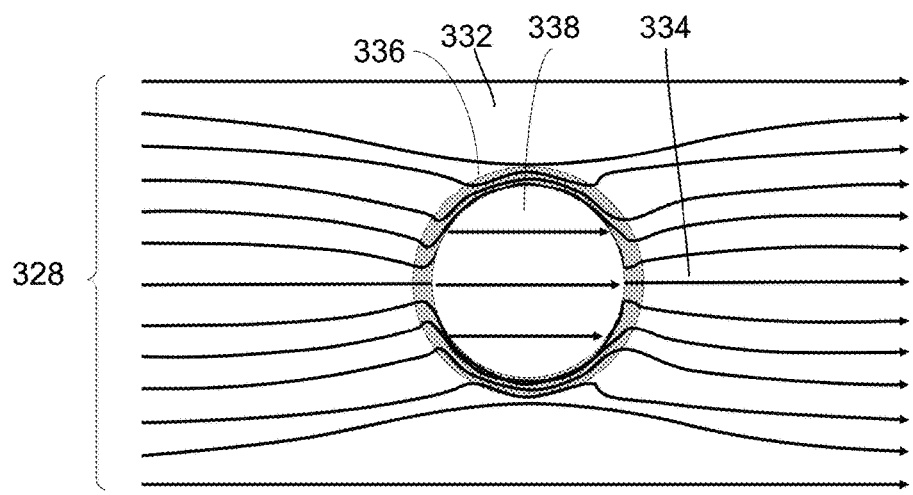
FIG. 3B is a schematic view of magnetic field lines interacting with a hollow high magnetic permeability sphere.

FIG. 3B illustrates magnetic field lines 328 interacting with a hollow sphere 336. This arrangement results in similar magnetically shielded regions 332 and regions of increased field strength 334, but also results in a magnetically shielded region 338 inside the hollow sphere 336.

Figure 4A:
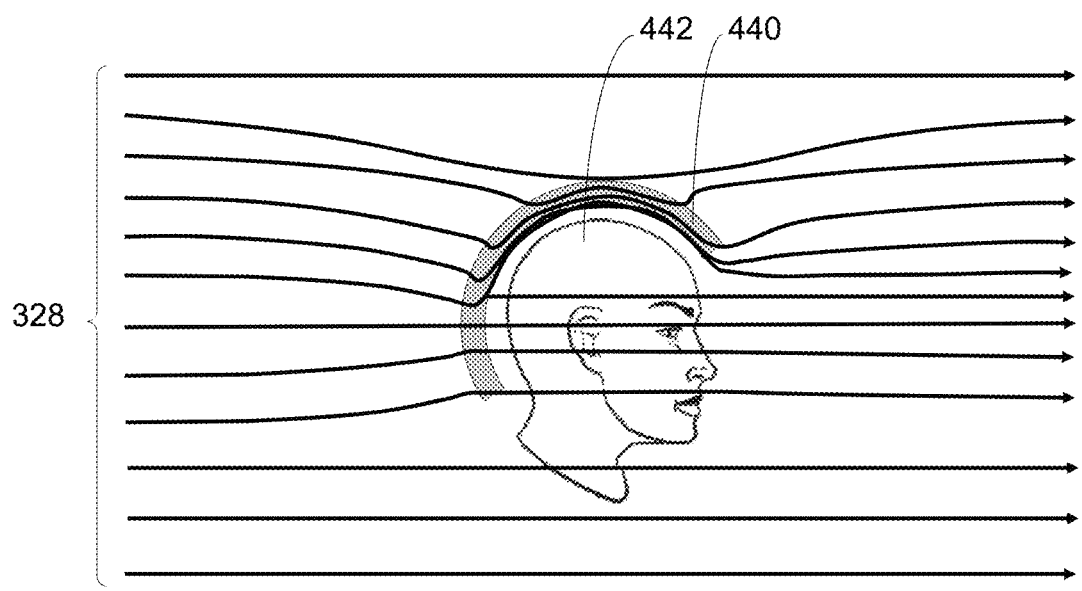
FIG. 4A is a schematic side view of one embodiment of passive shield for a wearable magnetic field measurement system and magnetic field lines interacting with the passive shield, according to the invention.
Figure 4B:
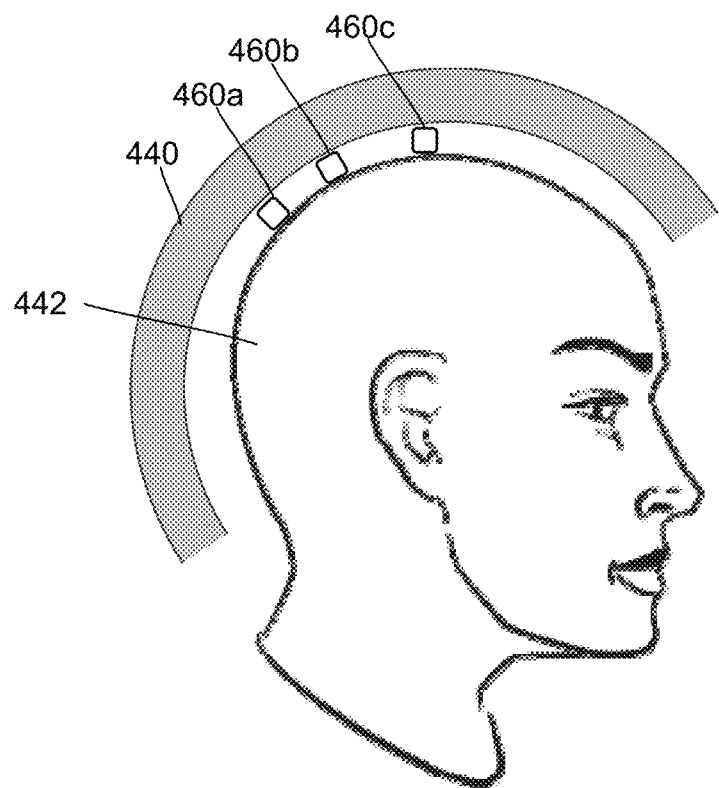
FIG. 4B is a schematic side view of components of a wearable magnetic field measurement system including the passive shield of FIG. 4A, according to the invention.

These features of ferromagnetic, and other high magnetic permeability materials can be used to produce passive shielding. FIG. 4A illustrates magnetic field lines 328 and one embodiment of a passive shield 440 for a magnetic field measurement system. The passive shield 440 forms a partial sphere (or other shape) to partially shield the magnetic environment of the head of the user 442. The passive shield 440 results in a shielded region of low magnetic field (from sources outside the passive shield) at the target area of the brain of the user 442. FIG. 4B illustrates components of a magnetic measurement system including the passive shield 440 and magnetometers 460a, 460b, 460c. By placing the passive shield 440 over the head of the user, the ambient background magnetic field arising from areas outside the passive shield is greatly decreased and the magnetometers 460a, 460b, 460c can measure or detect magnetic fields from activity occurring in the brain of the user 442 due to the reduction in the ambient background magnetic field.

In at least some embodiments, the passive shield 440 surrounds the magnetometers 460a, 460b, 460c except for directions from which magnetic fields that are to be measured will arise. For example, in the embodiment of FIG. 4B, the passive shield 440 can fit over and around the head to create a helmet, hood, cap, or other shape conformable to fit on the head of the user. FIGS. 7A-7F illustrate examples of embodiments of wearable devices having a shape of a helmet, hood, cap, or other shape conformable to fit on the head of the user, as described below. In at least some embodiments, the passive shield 440 includes cavities or sub-shields for the magnetometers 460a, 460b, 460c. The magnetometers are thus shielded on all sides except at the interface of the arrangement with the user's head where the magnetic fields of interest are generated. In at least some embodiments, the cavities in the passive shield 440 can be sized to keep all conductive materials far enough from the magnetometer to sufficiently mitigate Johnson Nyquist current noise-induced magnetic noise.

The passive shield 440 may improve sensitivity and may suppress unwanted background signals to allow better performance and simpler magnetic field measurement system design. Magnetic field measurement systems may be useful for the sensing of magnetic signals arising from very specific locations such as the human head. Magnetic field measurement systems can also be used to measure signals from the heart or other human organs, as well as non-biological magnetic field sources. The passive shield 440 and magnetometers 460a, 460b, 460c can be part of a wearable magnetic field measurement system. Preferably, the passive shield 440 is shaped to fit over a body region, for example, a user's head, upon which the magnetometers 460a, 460b, 460c and passive shield are to be worn by the user.

In at least some embodiments, the high magnetic permeability materials, or composite materials containing a high magnetic permeability material, of the passive shield 440 can be formed using sheet metal techniques, casting, molding, or 3D printing to match the specific shape of a given target, such as the human head. The material of the passive shield may be a pure high magnetic permeability material or a composite material such as epoxy, rubber, or plastic with high magnetic permeability material (for example, powder, fibers, or the like) embedded in it, a fabric or fiber composite including strands or strips of high magnetic permeability material, laminates including high magnetic permeability material layers, a loose powder of high magnetic permeability material contained and positioned by pouches or similar, or a ferrofluid, or any other suitable arrangement that includes the high magnetic permeability material. These resulting passive shield, or portions of the passive shield, may be rigid, flexible, fluid, have shape-memory, or the like as desired.

The passive shield 440 may also include one or more active electromagnetic windings to modify the magnetic domains of the high permeability material of the passive shield. These windings, when energized, allow the passive shield to be degaussed (demagnetized), subject to magnetic field shaking, or magnetized with a low-level of residual magnetic field before or during use. Any of these effects can increase the magnetic shielding performance of the passive shield.

In some embodiments, the passive shield 440 may also include components that extend beyond the target body region to help guide unwanted background magnetic field around the magnetometers. In one embodiment, a high magnetic permeability material is integrated into a scarf that connects to the passive shield within a helmet (see, for example, FIGS. 7C and 7D.) Magnetic fields from below the user's head would be redirected through the scarf and shunted to the helmet then out the top of the head and not interfere with the high sensitivity magnetometers within the helmet. The scarf can also be replaced with other form-factor options including, for example, a shirt-hoodie or collar. Other examples of items that might be attached to or part of a passive shield can include, but are not limited to, a handle, a helmet spike or protrusion, a shirt, a dickey, a hood, or the like or any other wearable item.

In at least some embodiments, the passive shield may not reduce the ambient background magnetic field sufficiently for the magnetometers to operate in the SERF regime (for example, less than 20 nT). Active shielding may also be used to further suppress the ambient background magnetic field. Examples of active shielding, including magnetic field generators, are presented in U.S. Provisional Patent Application Ser. Nos. 62/689,696; 62/699,596; and 62/732,327, all of which are incorporated herein by reference. As indicated above in FIG. 1A, to modify or control the magnitude of the ambient background magnetic field a magnetic field generator 162 (i.e., active shielding) can be positioned near or around one or more magnetometers 160. Any suitable magnetic field generator 162 can be used including, but not limited to, one or more Helmholtz coils, solenoid coils, planar coils, saddle coils, other electromagnets, or permanent magnets or any combination thereof. Active shielding can be provided along one, two, or three dimensions.

Figure 5A:
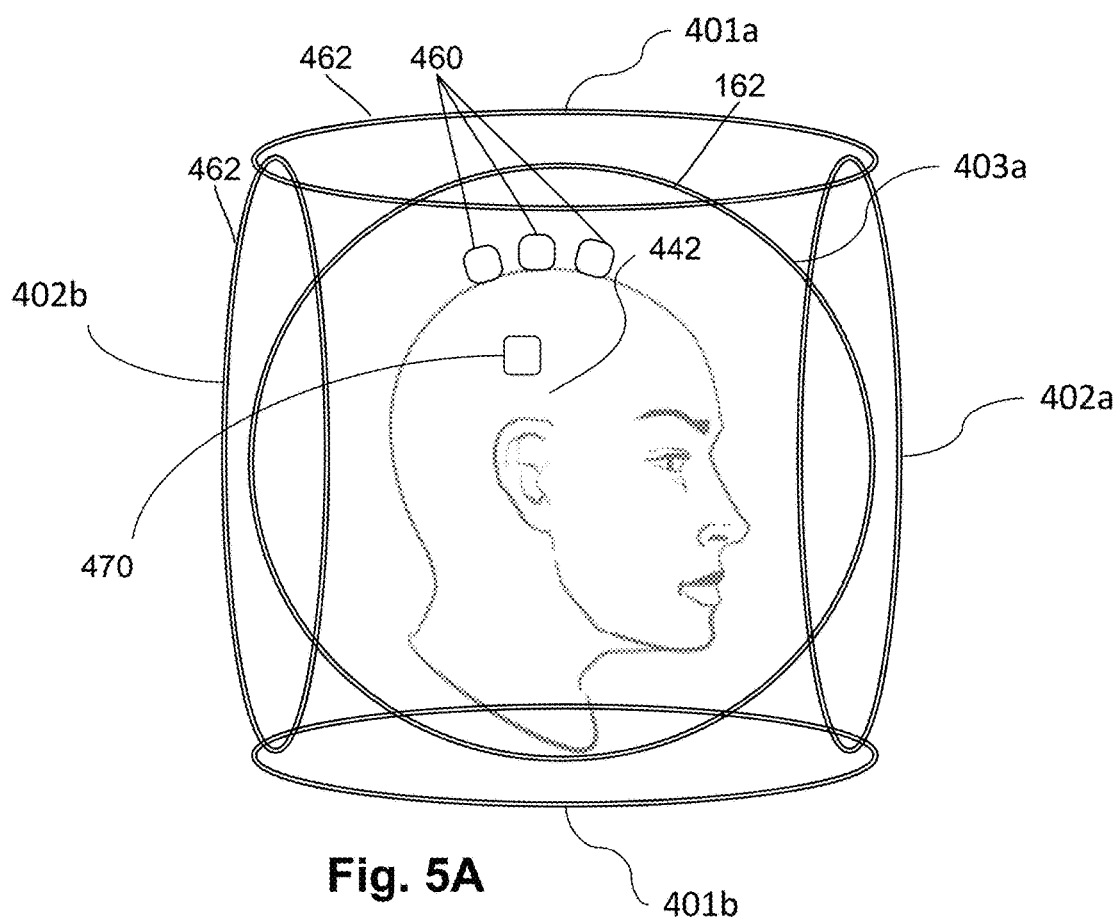
FIG. 5A is a schematic side view of an embodiment of a magnetic field measurement system with a magnetic field generator, according to the invention.

As an example, in FIG. 5A, the magnetic field generator 462 is a tri-axis Helmholtz coil electromagnet system with coils 401a, 401b, 402a, 402b, 403a, 403b (not shown). One embodiment of a Helmholtz coil includes two magnetic loops of diameter D that are separated by distance D to generate a uniform magnetic field along the center line that connects the two constituent coils. A single coil pair can provide active shielding along one dimension. To generate a 3-dimensional magnetic vector of arbitrary choosing, three sets of Helmholtz coils are used to form a tri-axis Helmholtz coil electromagnet system. The vertical Helmholtz coils 401a, 401b generate the vertical component of the magnetic field, Helmholtz coils 402a, 402b generate the front-back vector component and Helmholtz coils 403a, 403b (coil 403b is not shown in FIG. 5A) generate the left-right vector component. In at least some embodiments, the tri-axis Helmholtz coil electromagnet system is large compared to the human head so that the non-linear fields generated close to the coils are relatively far from the magnetometers. The magnetic field generator 462 can operate as active shielding for the magnetometers 460 so that the magnetometers can measure or observe magnetic fields generated within the brain at the user at, for example, site 470. In at least some embodiments, the magnetic field generator 462 (as active shielding) can be combined with the passive shield 440 (shown in FIG. 4A). In some embodiments, the passive shield 440 can be positioned within the magnetic field generator (for example, the magnetic field generator illustrated in FIG. 5A). In other embodiments, the magnetic field generator is disposed within or beneath the passive shield 440 (for example, beneath the passive shield 440 in FIG. 4B). In at least some embodiments, magnetic fields are suppressed sufficiently in one or two orthogonal directions by a passive shield 440 with active shielding provided along one or two other directions to simply the active shielding and reducing power and computational requirements, as compared to many conventional active shielding arrangements.

The embodiment illustrated in FIG. 5A uses a single magnetic field generator to provide active shielding for all of the magnetometers. In some embodiments, there may be little or no ability to individually control the ambient background magnetic field at the scale of the individual magnetometers.

Figure 5B:
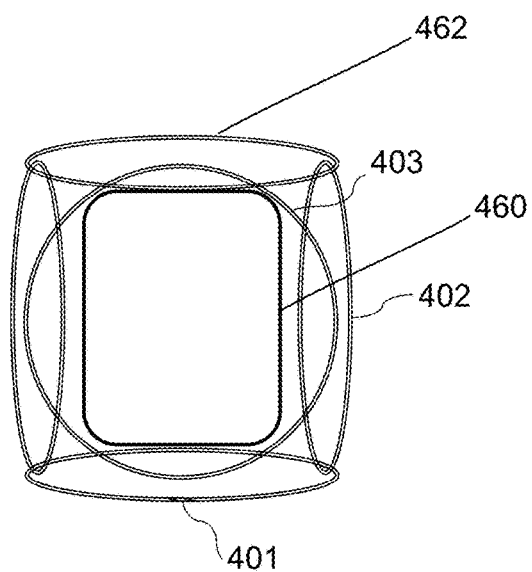
FIG. 5B is a schematic side view of an embodiment of a magnetometer with a magnetic field generator, according to the invention.

In other embodiments, as illustrated in FIG. 5B, a separate magnetic field generator 462 is provided for each magnetometer 460 or for each subset of magnetometers (for example, for a subset of two magnetometers forming a gradiometer). In this illustrated embodiment, a magnetic field generator 462 (such as a tri-axis Helmholtz coil electromagnet system 401, 402, 403) is positioned (for example, wound) around a single magnetometer 460. In at least some embodiments, each of the magnetometers of the magnetic field measurement system can each have a separate magnetic field generator. In other embodiments, each subset of magnetometers (for example, two, three, four, or more magnetometers) may have a separate magnetic field generator. This permits more local control of the active shielding than the arrangement illustrated in FIG. 5A. In other embodiments, a large scale active shielding (as in FIG. 5A) is combined with small scale active shielding (as in FIG. 5B), with the small scale active shielding providing fine corrections to further reduce the ambient background magnetic field that has already been reduced by the large scale active shielding and any passive shielding.

Figure 6A:
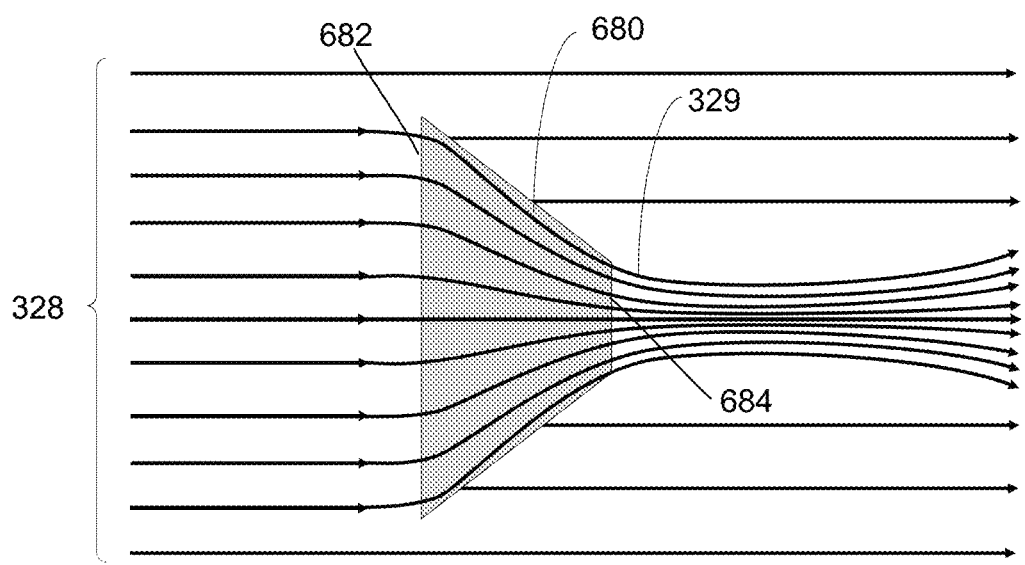
FIG. 6A is a schematic view of magnetic field lines interacting with a flux concentrator.

High magnetic permeability materials, such as ferrite, Mu-metal, Metglas, or other high magnetic permeability materials, can also be used to generate flux concentrators that can direct magnetic fields, such as those arising from the brain or other biological or nonbiological sources, toward one or more magnetometers. FIG. 6A illustrates one embodiment of a flux concentrator 680 which can be used to direct (for example, to squeeze) some of the magnetic field lines 328 into a tighter, or more concentrated, region 329 or to reorient the magnetic field lines 328 toward a desired or predetermined direction. This arrangement is considered to concentrate the magnetic field signals so that the magnetic flux density is larger at the exit end 684 of the flux concentrator 680 than at the entry end 682. In the illustrated example of FIG. 6A, the source of the magnetic field lines 328 is to the left and some of the magnetic field lines are concentrated into region 329 as the magnetic field lines passes through the shaped flux concentrator 680. The flux concentrator 680 can be used to concentrate, boost, amplify, reorient, or redirect the magnetic field signal from a certain region, such as the brain. The flux concentrator may also concentrate, boost, amplify, or redirect unwanted magnetic field signals from the environment (i.e., the ambient background magnetic field) and, therefore, may be used in conjunction with passive or active shielding to reduce or eliminate the ambient background magnetic field. In at least some embodiments, a flux concentrator can direct the magnetic field away from one or more (or even all) of the magnetometers.

In FIG. 6A, the flux concentrator 680 has a trapezoidal or triangular cross-sectional shape in which the entry end 682 has a larger width, length, or surface area than the exit end 684. At the exit end 684, the magnetic field signal (or magnetic flux) is significantly increased by the redirection or concentration of the magnetic field lines by the flux concentrator 680. In three dimensions, the flux concentrator 680 may have a conical shape or a pyramidal shape with three or four sides extending from a base, or any other suitable three-dimensional shape. In at least some embodiments, the tip of the conical or pyramidal or other three-dimensional shape is truncated to present an end 684 that has a larger surface area or more uniform flux density than an untruncated shape. Any other suitable shape that concentrates magnetic field signals at one end of the shape can be used for the flux concentrator. In at least some embodiments, the flux concentrator 680 has a first end and a second end opposite the first end and the flux concentrator is tapered so that the first end has a larger surface area than the second end. A flux concentrator 680 can have any other suitable shape that provides a desired redirection of the magnetic field lines. Accordingly, a flux concentrator can be considered to also be a flux shaper.

Figure 6B:
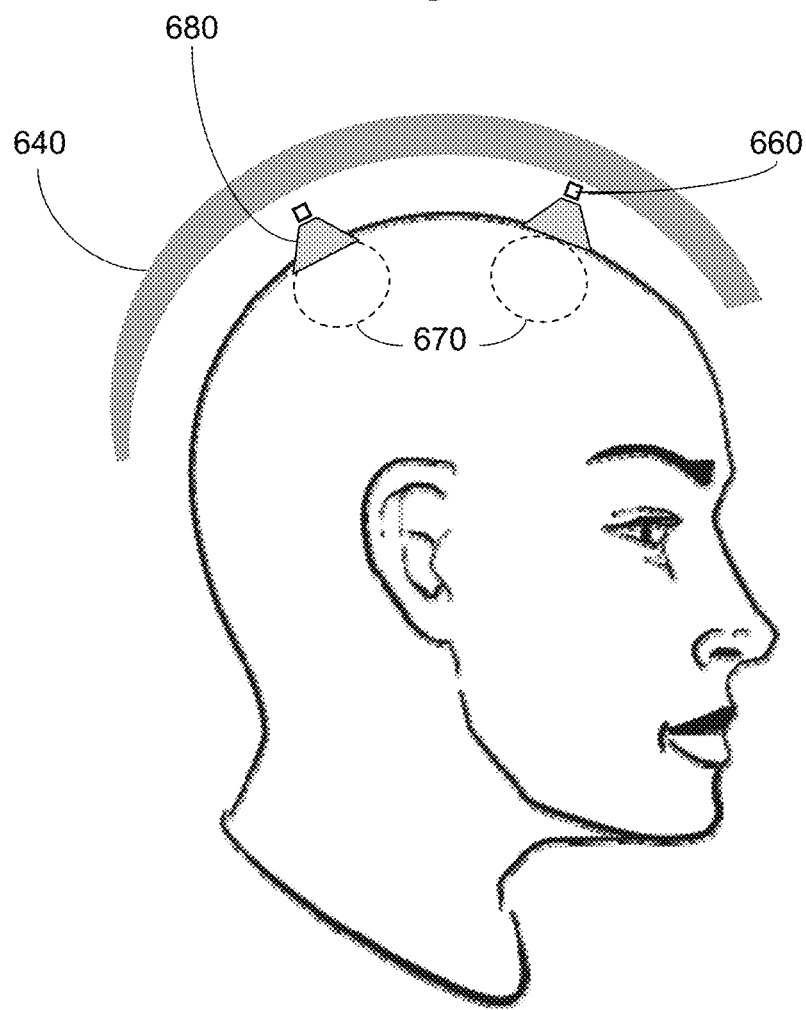
FIG. 6B is a schematic side view of one embodiment of a magnetic field measurement system with magnetometers, flux concentrators, and a passive shield, according to the invention.

The flux concentrator 680 can be used with any suitable magnetic field measurement system for concentrating magnetic field signals from a source and directing the concentrated magnetic field signals toward one or more magnetometers. In addition, the flux concentrator 680 can be used in conjunction with active or passive shielding. FIG. 6B illustrates one embodiment of a shielded wearable MEG system (e.g., a magnetic field measurement system) that includes a passive shield 640 (such as the passive shields described above) which can reduce the ambient background magnetic field, one or more magnetometers 660 disposed within the passive shield, and one or more flux concentrators 680 which can concentrates the magnetic field signals arising from regions 670 and directs or reorients the concentrated magnetic field signals toward the one or more magnetometers. In at least some embodiments, a different flux concentrator 680 is associated with each magnetometer 660. In other embodiments, a flux concentrator 680 can be associated with more than one magnetometer 660. In at least some embodiments, at least one flux concentrator 680 is associated with each magnetometer 660. In other embodiments, one or more of the magnetometers 660 are associated with a flux concentrator and one or more of the magnetometers are not associated with a flux concentrator.

Figure 6C:
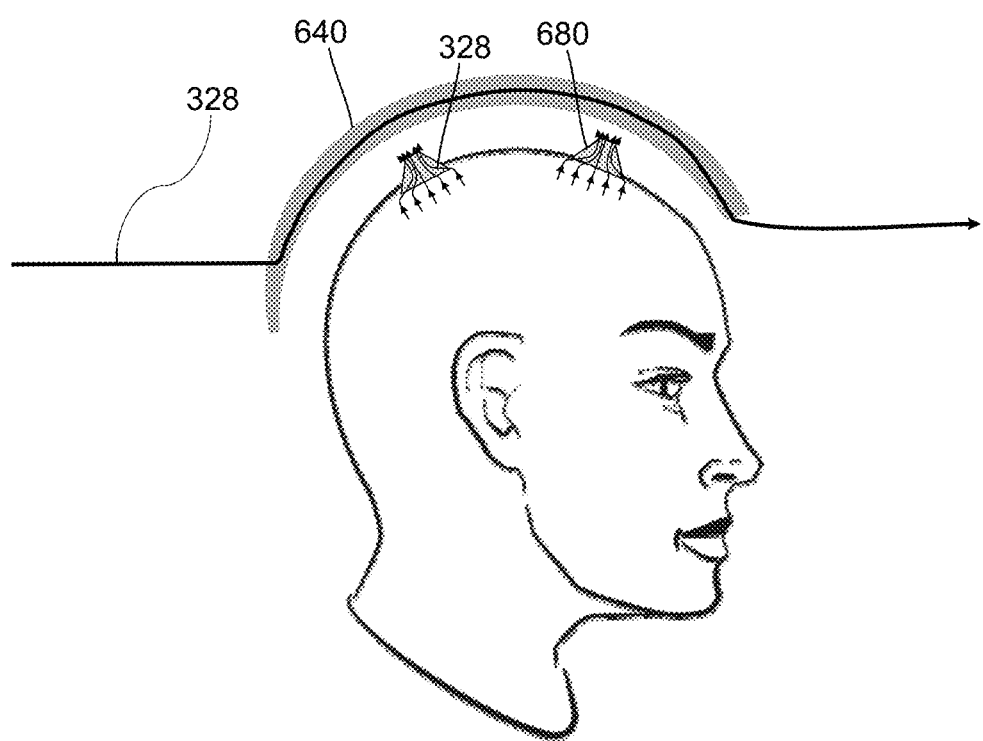
FIG. 6C is a schematic side view of magnetic field lines interacting with the flux concentrators and passive shield of FIG. 6B, according to the invention.

FIG. 6C illustrates the passive shield 640 and flux concentrators 680 showing some of the magnetic field lines 328 and how those fields lines are redirected or reoriented by the passive shield and flux concentrators. The magnetic field lines associated with the ambient background magnetic field are redirected by the passive shield 640 away from the head and the magnetic field lines generated in the brain are redirected and concentrated by the flux concentrators 680.

In at least some embodiments, the high magnetic permeability material, or composite materials containing a high magnetic permeability material, can be formed into a flux concentrator using sheet metal techniques, casting, molding, or 3D printing, or any other suitable method to generate the desired flux concentrator shape.

In at least some embodiments, any combination of one or more of the following: flux concentrators; passive shields; active magnetic field generators (such as described in, for example, U.S. Provisional Patent Application Ser. Nos. 62/689,696; 62/699,596; and 62/732,327, all of which are incorporated herein by reference), or other active shielding can be used for a wearable magnetic field measurement system, such as a wearable MEG system.

In at least some embodiments of magnetic field measurement systems that utilize scalar OPMs, flux concentrators may facilitate the detection of biological magnetic fields without passive or active shielding. In at least some embodiments, however, magnetic field measurement systems that utilize scalar OPMs can benefit from the combination of flux concentrators with passive or active shielding (or any combination thereof) to improve the signal to noise ratio.

In at least some embodiments, an arrangement includes a SERF magnetometer and a passive shield. In at least some embodiments, an arrangement includes a SERF magnetometer, a passive shield, and one or more flux concentrators. In at least some embodiments, an arrangement includes a SERF magnetometer, a passive shield, and active shielding. In at least some embodiments, an arrangement includes a SERF magnetometer, a passive shield, one or more flux concentrators, and active shielding. Any of these embodiments may also include a scalar magnetometer.

In at least some embodiments, an arrangement includes a scalar magnetometer and a passive shield. In at least some embodiments, an arrangement includes a scalar magnetometer, a passive shield, and one or more flux concentrators. In at least some embodiments, an arrangement includes a scalar magnetometer, a passive shield, and active shielding. In at least some embodiments, an arrangement includes a scalar magnetometer, a passive shield, one or more flux concentrators, and active shielding.

In at least some embodiments, two or more scalar magnetometers are arranged in a gradiometer configuration with at least one flux concentrator and, optionally, with a passive shield or active shielding or any combination thereof. In at least some embodiments, the flux concentrator is configured to direct the concentrated magnetic field signals toward at least one, but less than all, of the magnetometers of the gradiometer. In at least some embodiments, a SERF or scalar OPM is coupled with mechanisms or arrangement, other than high magnetic permeability materials, to amplify magnetic signals such as Lenz lenses or transformative optics techniques. In at least some embodiments, an arrangement includes a SERF or a scalar magnetometer or any combination of both to detect both a target magnetic signal of biological origin and a residual ambient background field present within a passive shield (with or without active shielding).

In at least some embodiments, a wearable passive shield, possibly 3D printed, is utilized to reduce the ambient background magnetic field. In at least some embodiments, a wearable passive shield, possibly 3D printed, is utilized to reduce the ambient background magnetic field in combination with active shielding. In at least some embodiments, a wearable passive shield, possibly 3D printed, is utilized to reduce the background magnetic field noise (which may be static or time varying). In at least some embodiments, a wearable passive shield, possibly 3D printed, is utilized to reduce background magnetic field noise (which may be static or time varying) in combination with active shielding. In at least some embodiments, a magnetic flux concentrator, possibly 3D printed, can be used to enhance sensitivity from a specific region of the target. In at least some embodiments, a combination with flux concentrator, passive shield, and, optionally, active shielding can enhance sensitivity to a target region and suppress sensitivity to other areas. In at least some embodiments, tailoring of the shield using 3D printing techniques can be used to match the shape of an individual target subject. In at least some embodiments, tailoring the shape of the flux concentrators can be used to measure magnetic fields of specific orientations with respect to the scalp or other body part.

At least some embodiments are capable of detecting MEG while the user is freely moving in the natural environment. In at least some embodiments, flux concentrators can reduce the electrical power used to generate the bias magnetic field defining the sensor sensitivity axis of scalar OPMs as described in, for example, U.S. Provisional Patent Application Ser. Nos. 62/689,696 and 62/699,596, incorporated herein by reference. In at least some embodiments, 3D printing techniques can be used to tailor the geometry of magnetic flux concentrators allowing "focused" sensing of particular regions of the brain or flow of electrical current within a region when multiple devices are used and the device is configured to measure in such a way to amplify or differentially amplify signals from a specific source.

Figure 7A:
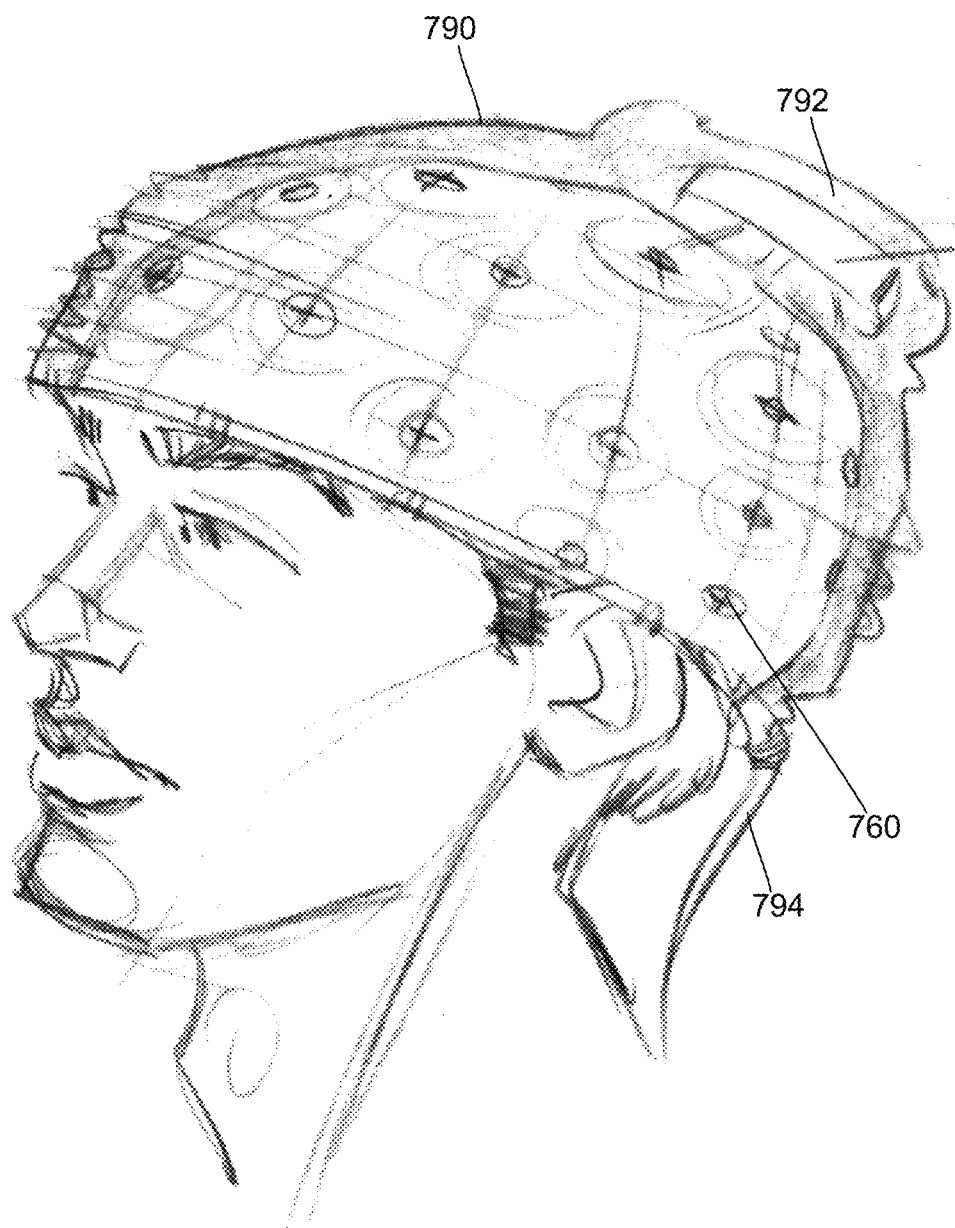
FIGS. 7A to 7F illustrate embodiments of wearable devices, according to the invention.
Figure 7B:
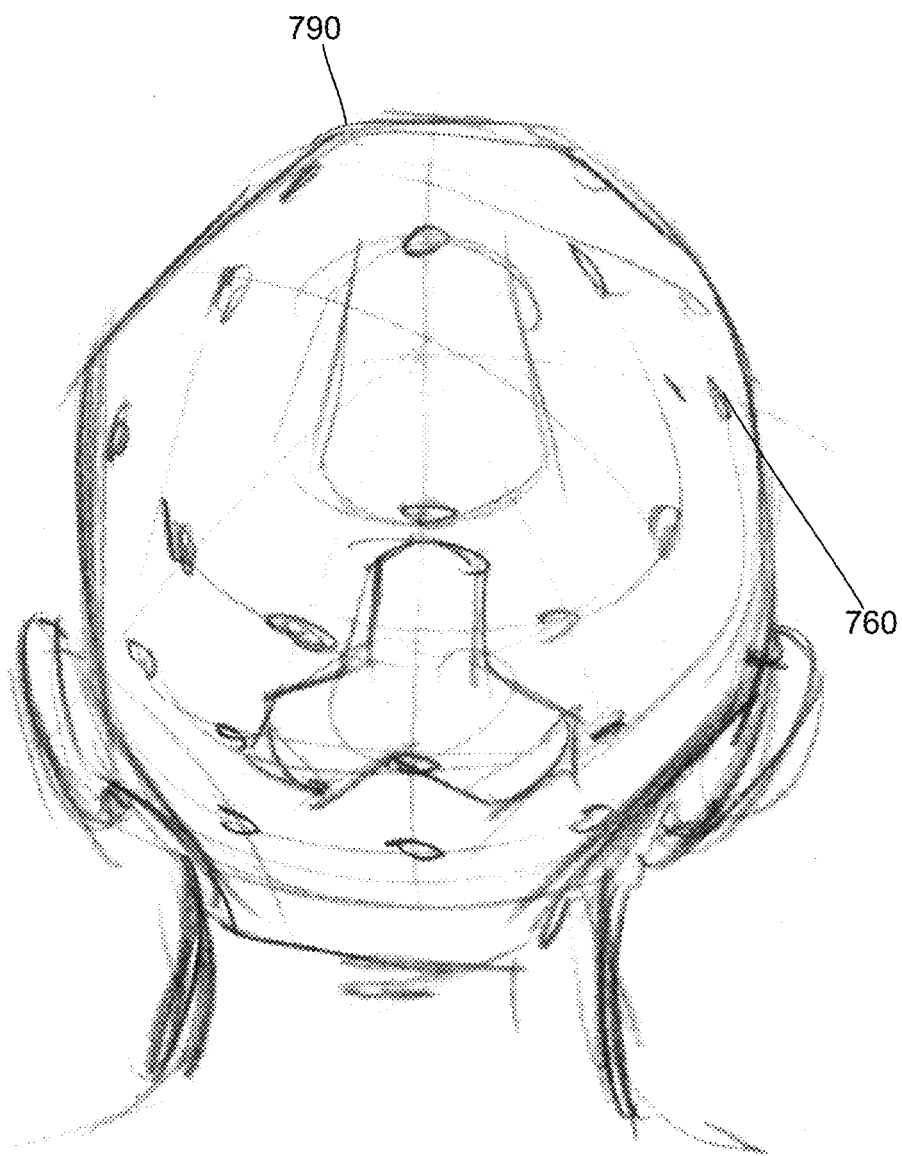
Figure 7C:
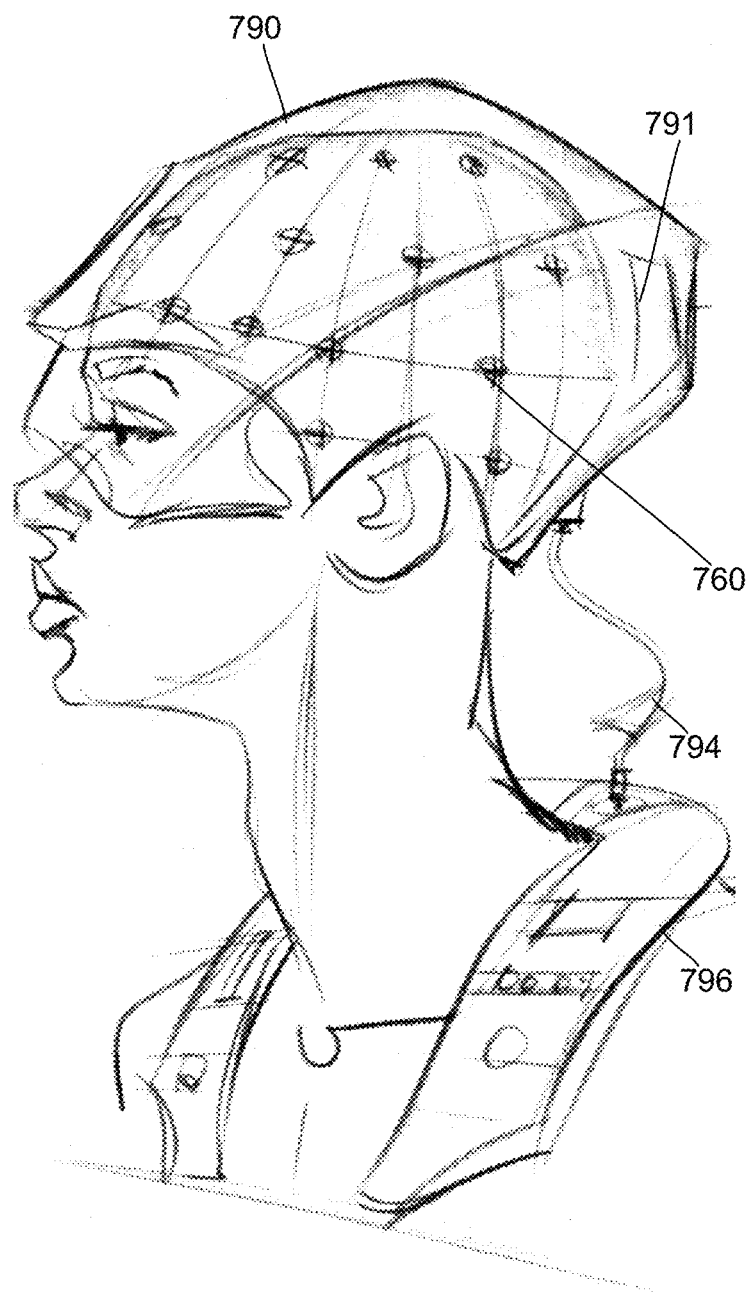

FIGS. 7A to 7F illustrate embodiments of a wearable device 790 that includes magnetometers 760 (illustrated in FIGS. 7A to 7F, but are embedded within the wearable device 790) and incorporates a passive shield or flux concentrators or any combination thereof. FIG. 7A illustrates an embodiment of a wearable device 790 in the form of a helmet with a handle 792. There is a cable 794 extending from the wearable device 790 for attachment to a battery or hub (with components such as a processor or the like). FIG. 7B illustrates another embodiment of a wearable device 790 in the form of a helmet. FIG. 7C illustrates a third embodiment of a wearable device 790 in the form of a helmet with the cable 794 leading to a wearable garment 796 (such as a vest or partial vest) that can include a battery or a hub. Alternatively or additionally, the wearable device 790 can include a crest 791 or other protrusion for placement of the hub or battery.

Figure 7D:
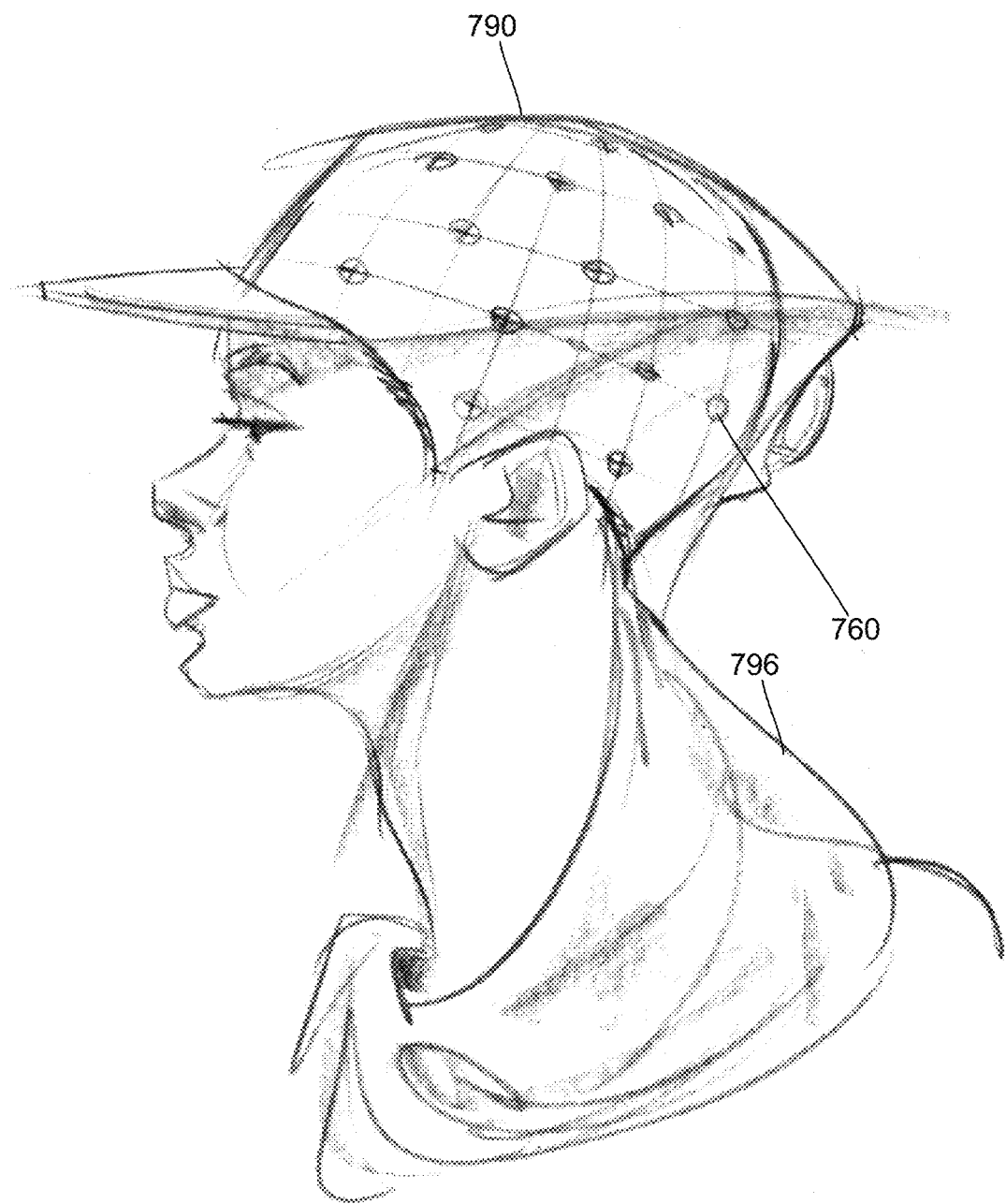
Figure 7E:
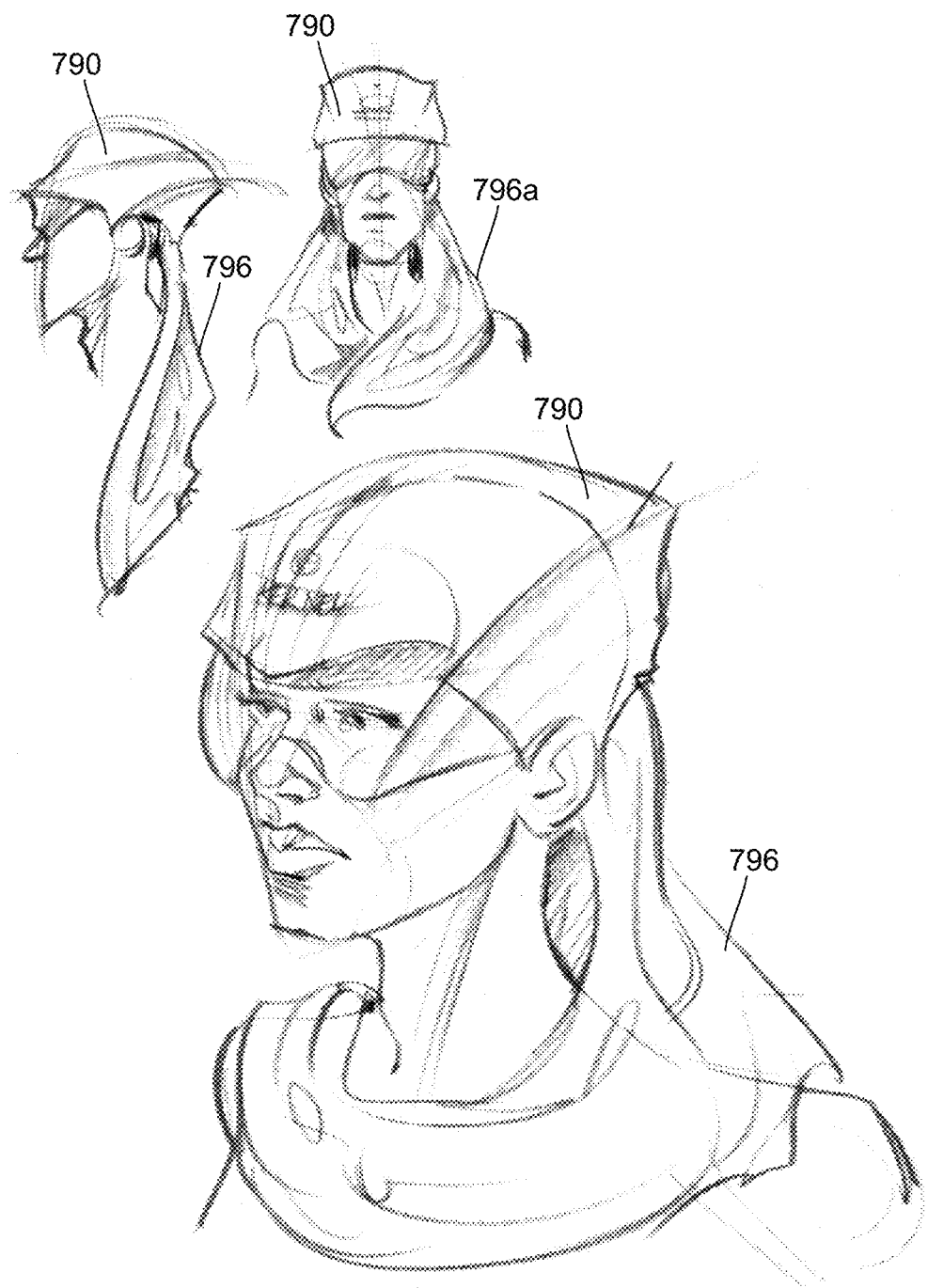
Figure 7F:
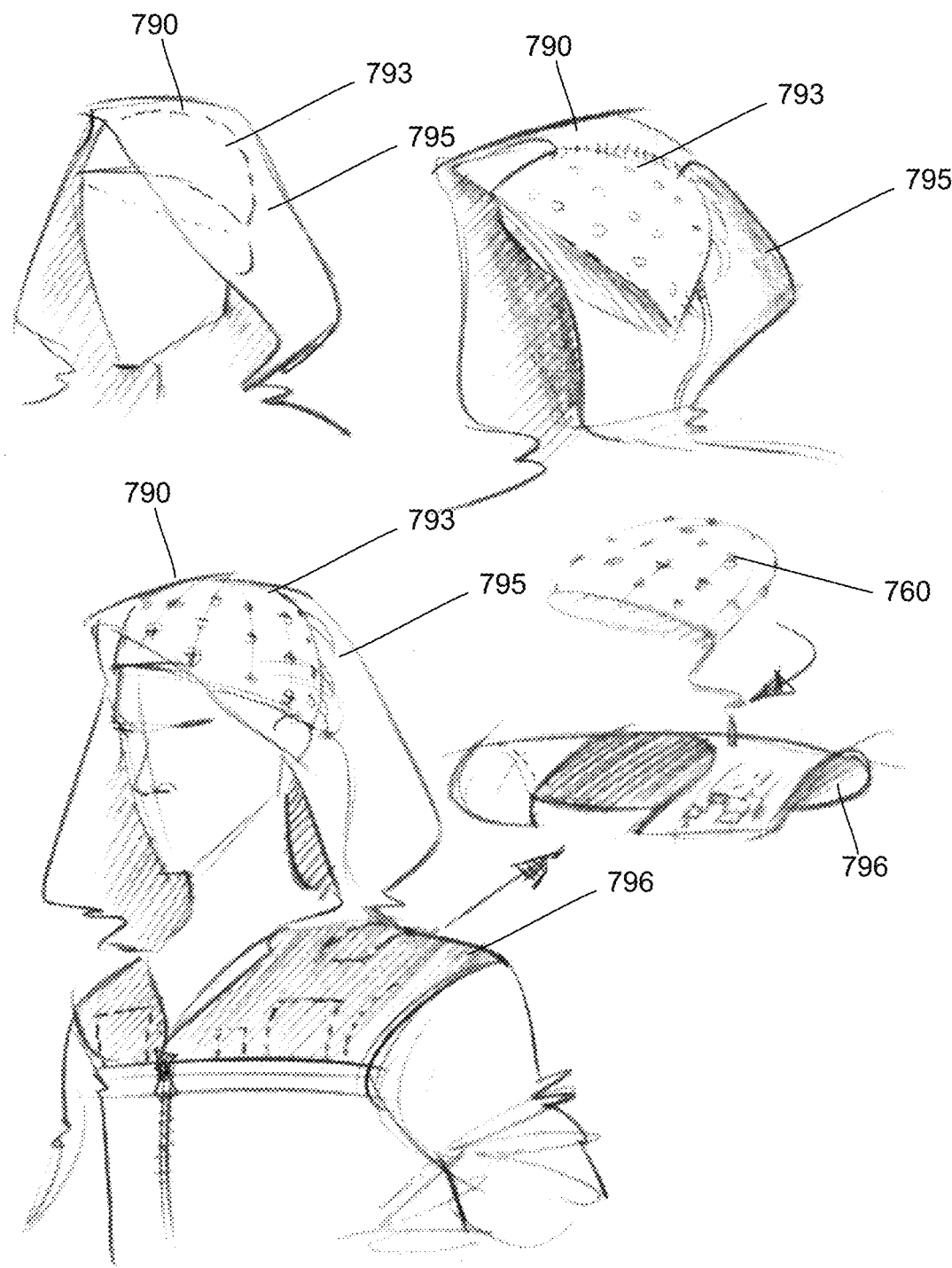

FIG. 7D illustrates another embodiment of a wearable device 790 in the form of a cap with a wearable garment 796 in the form of a scarf that may contain or conceal a cable, battery, or hub. FIG. 7E illustrates additional embodiments of a wearable device 790 in the form of a helmet with a one-piece scarf 796 or two-piece scarf 796a. FIG. 7F illustrates an embodiment of a wearable device 790 that includes a hood 795 (which may include a passive shield) and a beanie 793 which contains the magnetometers 760 (and may include a passive shield or flux concentrators), as well as a wearable garment 796 that may contain a battery or hub.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A magnetic field measurement system, comprising:
   a wearable article;
   at least one optically pumped magnetometer disposed on or in the wearable article; and
   at least one flux concentrator comprising a high magnetic permeability material and configured to receive magnetic field signals from a source, to concentrate the magnetic field signals or reorient the magnetic field signals in a preselected direction, and to direct the concentrated or reoriented magnetic field signals toward at least one of the at least one optically pumped magnetometer, wherein the at least one flux concentrator is disposed on or in the wearable article and configured, when the wearable article is worn, to be positioned between a wearer of the wearable article and the at least one optically pumped magnetometer.

2. The magnetic field measurements system of claim 1, wherein each of the at least one flux concentrator comprises a first end and a second end opposite the first end, wherein the at least one flux concentrator is tapered so that the first end has a larger surface area than the second end.

3. The magnetic field measurement system of claim 1, wherein each of the at least one flux concentrator has a three-dimensional conical or pyramidal shape.

4. The magnetic field measurement system of claim 3, wherein the three-dimensional conical or pyramidal shape is truncated at one end.

5. The magnetic field measurement system of claim 1, wherein the high magnetic permeability material is selected from ferrite, Mu-metal, or any combination thereof.

6. The magnetic field measurement system of claim 1, the at least one optically pumped magnetometer comprises a plurality of optically pumped magnetometers and the at least one flux concentrator comprises a plurality of flux concentrators.

7. The magnetic field measurement system of claim 6, wherein each of the flux concentrators is configured to direct the concentrated or reoriented magnetic field signals to a different one of the optically pumped magnetometers.

8. The magnetic field measurement system of claim 6, wherein at least two of the optically pumped magnetometers form a gradiometer.

9. The magnetic field measurement system of claim 8, wherein one of the flux concentrators is configured to direct the concentrated or reoriented magnetic field signals toward at least one, but less than all, of the optically pumped magnetometers of the gradiometer.

10. The magnetic field measurement system of claim 1, further comprising a passive shield disposed around the at least one optically pumped magnetometer and configured to reduce an ambient background magnetic field at the at least one optically pumped magnetometer.

11. The magnetic field measurement system of claim 10, wherein the passive shield is made of a high magnetic permeability material.

12. The magnetic field measurement system of claim 10, wherein the passive shield is formed in a shape of a helmet, hood, cap, or other shape conformable to a user's head.

13. The magnetic field measurement system of claim 10, further comprising a magnetic field generator disposed around the at least one optically pumped magnetometer and configured to reduce an ambient background magnetic field at the at least one optically pumped magnetometer.

14. The magnetic field measurement system of claim 1, further comprising a magnetic field generator disposed around the at least one optically pumped magnetometer and configured to reduce an ambient background magnetic field at the at least one optically pumped magnetometer.

15. The magnetic field measurement system of claim 1, wherein the magnetic field measurement system is configured to operate the at least one optically pumped magnetometer in a scalar mode.

16. The magnetic field measurement system of claim 1, wherein the magnetic field measurement system is configured to operate the at least one optically pumped magnetometer in a SERF mode.

17. A wearable magnetic field measurement system, comprising:
   a plurality of magnetometers arranged in an array;
   a passive shield comprising a high magnetic permeability material and disposed around the magnetometers and configured to reduce an ambient background magnetic field at the magnetometers, wherein the passive shield is shaped to fit over a body region upon which the magnetometers and passive shield are to be worn; and
   a magnetic field generator disposed around the magnetometers and configured to reduce an ambient background magnetic field at the magnetometers.

18. The magnetic field measurement system of claim 17, wherein the passive shield is formed in a shape of a helmet, hood, cap, or other shape conformable to a user's head.

19. The magnetic field measurement system of claim 17, further comprising at least one flux concentrator configured to receive magnetic field signals from a source, to concentrate the magnetic field signals or reorient the magnetic field signals in a preselected direction, and to direct the concentrated or reoriented magnetic field signals toward at least one of the magnetometers.

* * * * *